United States Patent
Zou et al.

(10) Patent No.: US 11,916,490 B2
(45) Date of Patent: *Feb. 27, 2024

(54) MULTI-FUNCTIONAL PCB FOR ASSEMBLING GAN-BASED POWER CONVERTER

(71) Applicant: INNOSCIENCE (SUZHOU) TECHNOLOGY CO., LTD., Suzhou (CN)

(72) Inventors: Yanbo Zou, Suzhou (CN); Fada Du, Suzhou (CN); Chao Tang, Suzhou (CN); Wenjie Lin, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 349 days.

This patent is subject to a terminal disclaimer.

(21) Appl. No.: 17/376,133

(22) Filed: Jul. 14, 2021

(65) Prior Publication Data
US 2022/0256707 A1    Aug. 11, 2022

Related U.S. Application Data

(63) Continuation of application No. 17/419,715, filed as application No. PCT/CN2021/076566 on Feb. 10, 2021.

(51) Int. Cl.
*H02M 3/335*    (2006.01)
*H01F 27/28*    (2006.01)

(52) U.S. Cl.
CPC .... *H02M 3/33576* (2013.01); *H01F 27/2804* (2013.01); *H01F 2027/2819* (2013.01)

(58) Field of Classification Search
CPC ..... H01F 2027/2819; H01F 2027/2809; H01F 2027/2804; H01F 41/041; H02M 3/33576;

(Continued)

(56) References Cited

U.S. PATENT DOCUMENTS 8,031,494 B2 * 10/2011 Brkovic ............ H02M 3/33523
363/21.08
8,310,327 B2 * 11/2012 Willers ................. H01F 27/06
336/200

(Continued)

FOREIGN PATENT DOCUMENTS

CN    104934209 A    9/2015
CN    106130349 A    11/2016

(Continued)

OTHER PUBLICATIONS

Office Action of corresponding China patent application No. 202111436876.7 dated Jul. 25, 2022.

(Continued)

*Primary Examiner* — Harry R Behm
(74) *Attorney, Agent, or Firm* — JCIPRNET

(57) ABSTRACT

The present invention provides a multi-functional printed circuit board (PCB) for assembling a plurality of components of a power converter in to a single package. The PCB comprises: one or more planar coils respectively formed on one or more PCB layers and aligned with each other for constructing the transformer and the coupler; and a plurality of conducting traces and vias for providing electrical connection among the plurality of components of the power converter.

20 Claims, 22 Drawing Sheets

(58) Field of Classification Search
CPC ......... H02M 3/003; H05K 1/165; H05K 1/18; H05K 3/30; H05K 2201/0723; H05K 2201/086; H05K 1/0216; H05K 1/11; H01L 23/49838; H01L 21/50; H01L 23/14; H01L 23/552; H01L 29/7786
See application file for complete search history.

(56) References Cited

U.S. PATENT DOCUMENTS

| | | | |
|---|---|---|---|
| 10,128,766 | B1 | 11/2018 | Strijker et al. |
| 10,284,092 | B1 | 5/2019 | Elsayad et al. |
| 2009/0109711 | A1 | 4/2009 | Hsu |
| 2009/0257250 | A1 | 10/2009 | Liu |
| 2015/0048917 | A1* | 2/2015 | Uchiyama ............ H05K 1/0209 336/200 |
| 2016/0172962 | A1 | 6/2016 | Chen et al. |
| 2016/0329819 | A1 | 11/2016 | Chen et al. |
| 2016/0358705 | A1 | 12/2016 | Lin et al. |
| 2018/0351462 | A1 | 12/2018 | Li et al. |
| 2020/0203053 | A1* | 6/2020 | Scholz ................... H05K 1/141 |

FOREIGN PATENT DOCUMENTS

| | | | |
|---|---|---|---|
| CN | 108075666 A | 5/2018 | |
| CN | 111711370 A | 9/2020 | |
| CN | 112104202 A | 12/2020 | |
| EP | 3035349 B1 * | 9/2018 | ......... H01F 27/2823 |
| WO | 2011070015 | 6/2011 | |

OTHER PUBLICATIONS

International Search Report and Written Opinion of the corresponding PCT application No. PCT/CN2021/076566 dated Nov. 22, 2021.
Notice of Allowance of the corresponding China patent application No. 202180002809.6 dated Jul. 11, 2022.
Notice of Allowance of the corresponding China patent application No. 202111436877.1 dated Jul. 11, 2022.
United States Patent and Trademark Office, non-final office action, Office Action Issued in U.S. Appl. No. 17/419,715, dated Aug. 29, 2023, 28 pages.
United States Patent and Trademark Office, non-final office action, Office Action Issued in U.S. Appl. No. 17/376,102, dated Sep. 6, 2023, 20 pages.
United States Patent and Trademark Office, non-final office action, Office Action Issued in U.S. Appl. No. 17/376,129, dated Aug. 29, 2023, 27 pages.
United States Patent and Trademark Office, non-final office action, Office Action Issued in U.S. Appl. No. 17/376,130, dated Aug. 29, 2023, 28 pages.
United States Patent and Trademark Office, non-final office action, Office Action Issued in U.S. Appl. No. 17/376,132, dated Sep. 6, 2023, 26 pages.

* cited by examiner

MULTI-FUNCTIONAL PCB FOR ASSEMBLING GAN-BASED POWER CONVERTER

CROSS-REFERENCE TO RELATED APPLICATIONS

The present application is a continuation application of U.S. Non-Provisional patent application Ser. No. 17/419,715 filed Jun. 30, 2021, and the disclosure of which is incorporated herein by reference in its entirety.

TECHNICAL FIELD

The present disclosure generally relates to a high efficiency, high density power converter, and more particularly to a Gallium Nitride (GaN) based power converter with a multi-functional printed circuit board formed with planar electromagnetic components such as transformers and couplers Background:

Power converters based on GaN High-Electron-Mobility Transistor (HEMT) have been widely used for fast charging and power conversion in mobile devices because of their low power losses and fast switching transition.

In general, power converter uses transformer having a primary coil and a secondary coil for transferring power from a power supply to a load. Currents flowing in the primary and secondary coils are conducted or blocked with a primary-side and a secondary-side switching devices, which are controlled by a primary-side and a second-side controllers respectively. The manufacture of the transformer involves winding the wire around a core or bobbin structure, which are most difficult to miniaturize. Moreover, as the operating frequency become higher, it is required to ensure the primary-side and secondary-side switches to turn on and off alternatively to avoid malfunction of the power converter. Some approaches used opto-couplers for communication between the primary-side with the second-side controllers to avoid simultaneously turning on of the primary-side and secondary-side switches. However, opto-couplers have problems of high-power consumption, short life-time, dependency on ambient temperature and low reliability.

SUMMARY

An object of the present disclosure is to provide a GaN-based power converter having a more reliable and stable communication between the primary-side and secondary-side controllers for meeting the continual requirements to operate at higher frequency. Another object of the present disclosure is to provide a GaN-based power converter with a more compact size for facilitating integration of more functions into a single mobile device.

According to one aspect of the present disclosure, it is provided with a GaN-based power converter comprising: a transformer; a magnetic coupler; a primary switch; a secondary switch; a primary controller; a secondary controller; a multi-layered print circuit board (PCB) comprising: one or more planar coils respectively formed on one or more PCB layers and aligned with each other for constructing the transformer and the coupler; and a plurality of conducting traces and vias for providing electrical connection among the transformer, the coupler, a primary switch, a secondary switch, a primary controller and a secondary controller. The power converter further comprises a pair of ferrite cores being fixed to a top surface and a bottom surface of the PCB respectively and commonly shared by the transformer and the coupler.

The transformer is configured to transfer power by switching on and off the primary switch and the secondary switch at a switching frequency. The coupler is configured to transfer a synchronization signal from the primary controller to the secondary controller such that the primary switch and the secondary switch are turned on and off alternately to ensure proper functioning of the transformer; and the synchronization signal transferred by the coupler has a carrier frequency different from the switching frequency.

As the transformer and the magnetic coupler are constructed with planar coils built in the PCB, the profile of the power converter can be greatly reduced. Furthermore, the primary controller and the secondary controller can communicate with each other through the magnetic coupler to turn on and off the primary and secondary switches alternatively to ensure proper functioning of the transformer even at high operation frequency. As the synchronization signal transferred by the magnetic coupler has a carrier frequency different from the switching frequency of the primary and secondary switches, cross-talk between the transformer and the magnetic coupler can be avoided.

BRIEF DESCRIPTION OF THE DRAWINGS

Preferred embodiments of the present disclosure are described in more detail hereinafter with reference to the drawings, in which.

DETAILED DESCRIPTION

In the following description, embodiments of GaN-based power converters and multi-functional printed circuit board (PCB) are set forth as preferred examples in accordance with the present disclosure. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Reference in this specification to "one embodiment" or "an embodiments" means that a particular feature, structure, or characteristic described in connection with the embodiment is included in at least one of the embodiments of the invention. The appearances of the phrase "in one embodiment" or "in some embodiments" in various places in the specifications are not necessarily all referring to the same embodiments, nor are separate or alternative embodiments mutually exclusive of other embodiments. Moreover, various features are described which may be exhibited by some embodiments and not by others.

Figure 1A:
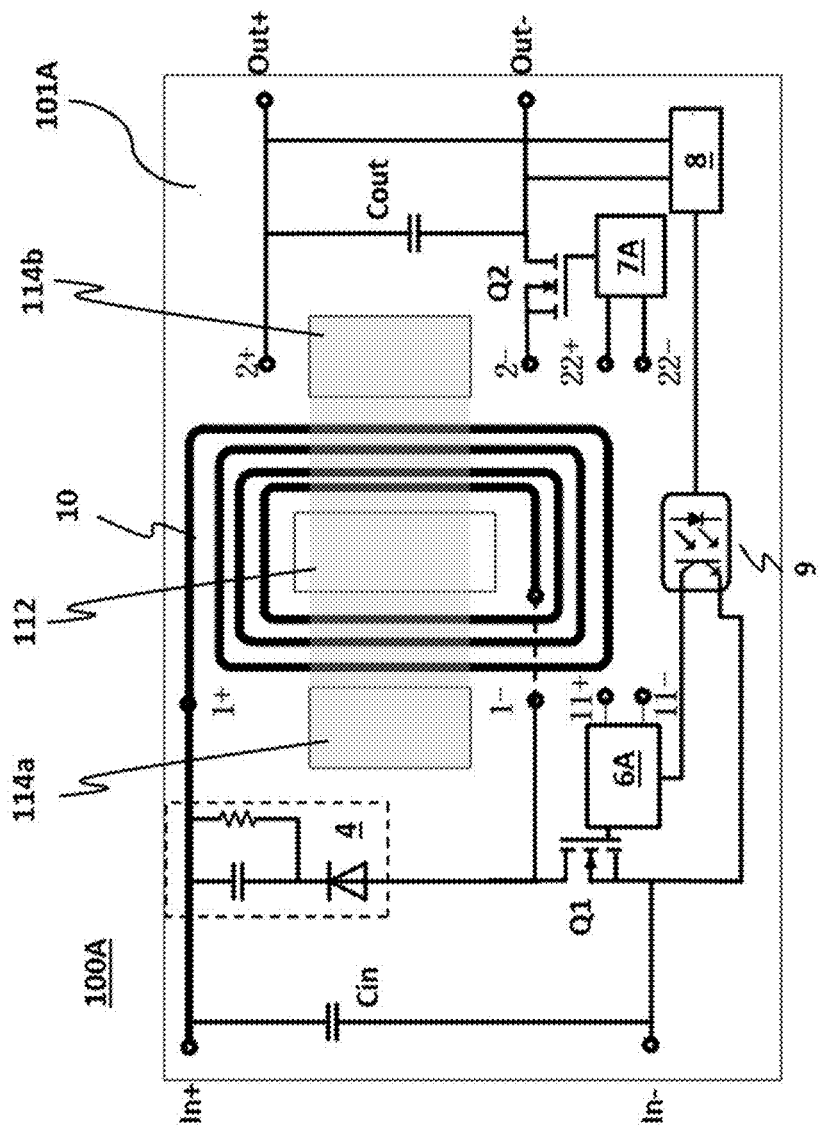
FIGS. 1A and 1B respectively depict a schematic top view and a circuit diagram of a GaN-based power converter according to some embodiments of the present disclosure.
Figure 1B:
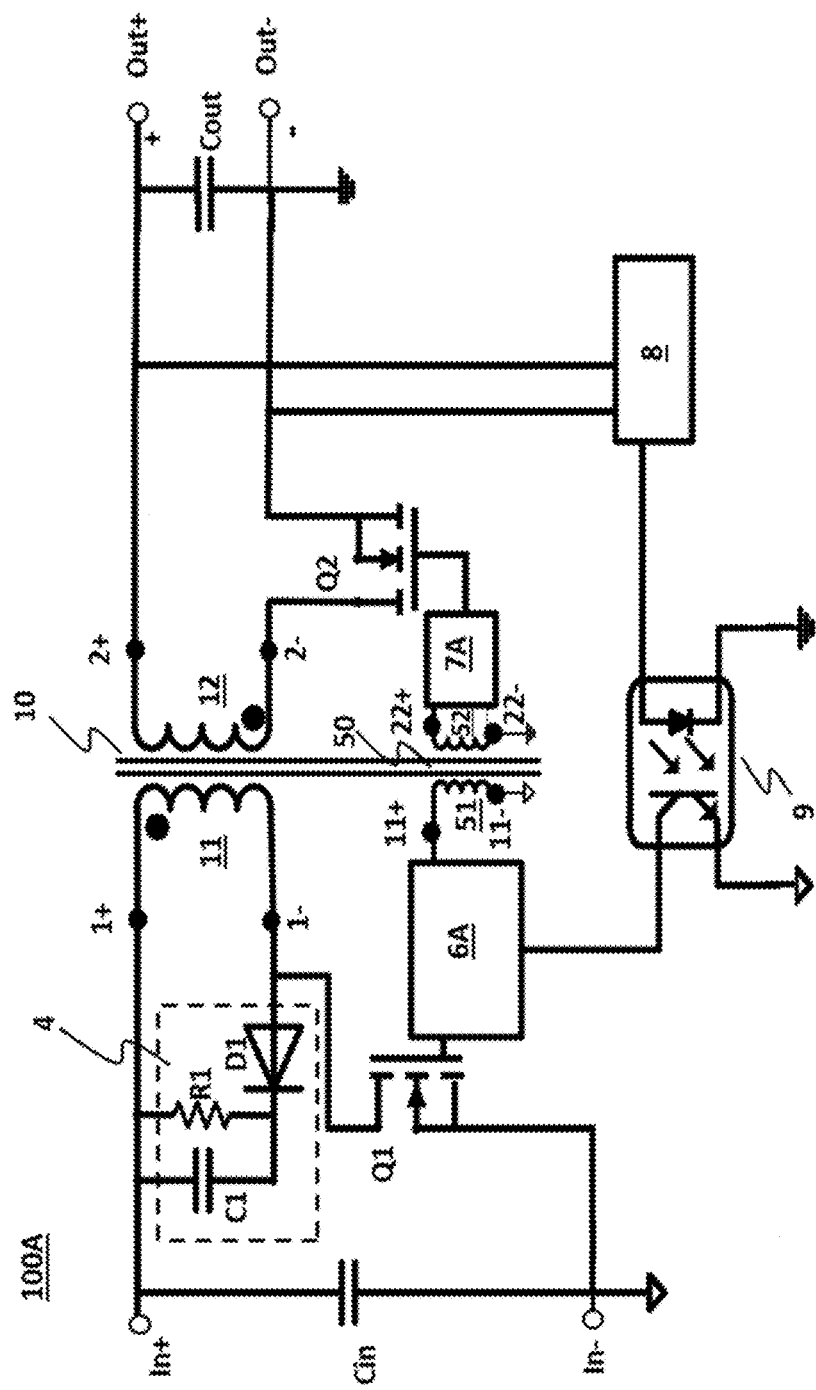

FIGS. 1A and 1B depict a schematic diagram and a circuit diagram of a GaN-based power converter 100A according to some embodiments of the present disclosure.

Referring to FIGS. 1A and 1B. The power converter 100A may comprise a multi-functional printed circuit board (PCB) 101A comprising a plurality of conducting traces and vias for integrating a plurality of components of the power converter 100A. The power converter 100A may further comprise a thermal conductive compound (not shown) for encapsulating the plurality of components the power converter 100A and the PCB 101A into a single package.

The power converter 100A may have an input port 2 having a positive input node (In+) and a negative input node (In−), and an output port 3 having a positive output node (Out+) and a negative output node (Out−).

The multi-functional PCB 101A may comprise a positive input contact to act as a positive input node (In+), a negative input contact to act as the negative input node (In−), a positive output contact to act as the positive output node (Out+) and a negative output contact to act as the negative output node (Out−).

The power converter 100A may further comprise an input capacitor Cin being attached to the PCB 100A and having a first terminal connected to the positive input contact and a second terminal connected to the negative input contact.

The power converter 100A may further comprise an output capacitor Cout being attached to the PCB 101A and having a first terminal connected to the positive output contact and a second terminal connected to the negative output contact.

The power converter 100A may further comprise a planar transformer 10 formed in the PCB and configured for transferring power from a power supply coupled to the input port 2 to a load coupled to the output port 3. The transformer 10 may comprise a transformer primary winding 11 and a transformer secondary winding 12.

The transformer primary winding 11 may have a positive primary terminal (1+) and a negative primary terminal (1−). The positive primary terminal may be electrically connected to the positive input contact. The transformer secondary winding 12 may have a positive secondary terminal (2+) and a negative secondary terminal (2−). The positive secondary terminal may be electrically connected to the positive output contact.

The power converter 100A may further comprise a clamping circuit 4 configured for clamping an input voltage to a desired DC level. The clamping circuit may have a diode D1, a capacitor C1 and a resistor R1. The diode D1 may be attached to the PCB 101A and have a positive terminal electrically connected to the second terminal of the transformer primary winding 11. The capacitor C1 may be attached to the PCB 101A and have a first terminal electrically connected to the positive input node (In+) and a second terminal electrically connected to the negative terminal of the diode D1. The resistor R1 may be attached to the PCB 101A and have a first terminal electrically connected to the positive input node (In+) and a second terminal electrically connected to the negative terminal of the diode D1.

The power converter 100A may further comprise a primary switch Q1 configured for conducting or blocking a current flowing in the transformer primary winding 11. The primary switch Q1 may be attached on the PCB 101A and have a first power terminal electrically connected to the negative primary terminal (1−) of the transformer primary winding 11 and a second power terminal electrically connected to the negative input node (In−).

The converter 100A may further comprise a secondary switch Q2 configured for conducting or blocking a current flowing in the transformer secondary winding 12. The secondary switch Q2 may be attached on the PCB 101A and have a first power terminal electrically connected to the negative secondary terminal (2−) of the transformer secondary winding 12; and a second power terminal electrically connected to the negative output node (Out−).

Preferably, each of the primary switch Q1 and secondary switch Q2 may be constructed with a transistor. The transistor may be a HEMT (High electron mobility transistor) or a MOSFET (Metal Oxide Semiconductor Field Effect Transistor). The MOSFET may be selected from a N-channel enhancement type MOSFET, a N-channel depletion type MOSFET, a P-channel enhancement type MOSFET, or a P-channel depletion type MOSFET. The transistor may be formed of or include a direct bandgap material, such as an III-V compound, which includes, but not limited to, for example, GaAs, InP, GaN, InGaAs and AlGaAs.

In some embodiments, each of the primary switch Q1 and secondary switch Q2 may be constructed with an enhancement type GaN HEMT based transistor having a drain being the first power terminal, a source being the second power terminal and a gate being the control terminal.

The power converter 100A may further comprise a primary controller 6A configured to generate a primary control signal $V_{pri\_ctrl}$ to turn on and off the primary switch Q1. The primary controller 6A may be attached on the PCB 101A and have a primary control (Pri_Ctrl) node electrically connected to a control terminal of the primary switch Q1.

The converter 100A may further comprise a secondary controller 7A configured to generate a secondary control signal $V_{sec\_ctrl}$ to turn on and off the secondary switch Q2. The secondary controller 7A may be attached on the PCB 101A and have a secondary control (Sec_Ctrl) node electrically connected to a control terminal of the secondary switch Q2.

The power converter 100A may further comprise a feedback module 8 configured for detecting a voltage across the output port 3 and feeding a feedback signal $V_{FB}$ to a feedback (FB) node of the primary controller 6A through an opto-coupler 9.

The feedback module 8 may be attached on the PCB 100A and have a first input terminal electrically connected to the positive output node (Out+), a second input terminal electrically connected to the negative output node (Out−).

The opto-coupler 9 may be attached on the PCB 100A and having an input terminal electrically connected to an output terminal of the feedback module 8 and an output terminal electrically connected to the feedback (FB) node of the primary controller 6A.

The power converter 100A may further comprise a planar magnetic coupler 50 formed in the PCB 101A and configured for coupling a synchronization signal from the primary controller 6A to the secondary controller 7A such that the secondary controller 7A can be synchronized or cooperated with the primary controller 6A to turn on and off the primary switch and the secondary switch alternately to ensure proper functioning of the power converter 100A.

The magnetic coupler 50 may have a coupler primary winding 51 and a coupler secondary winding 52. The coupler primary winding 51 may have a positive primary terminal (11+) electrically connected to a primary synchronization (Pri_Syn) node of the primary controller 6A and a negative primary terminal (11−) electrically connected to the negative input node (In−). The coupler secondary winding 52 may have a positive secondary terminal (22+) electrically connected to a secondary synchronization (Sec_Syn) node of the secondary controller 7A and a negative secondary terminal (22−) electrically connected to the negative output node (Out−).

The PCB 101A may comprise one or more planar conductive coils respectively formed on one or more PCB layers and aligned with each other for constructing the transformer and the coupler.

Figure 2:
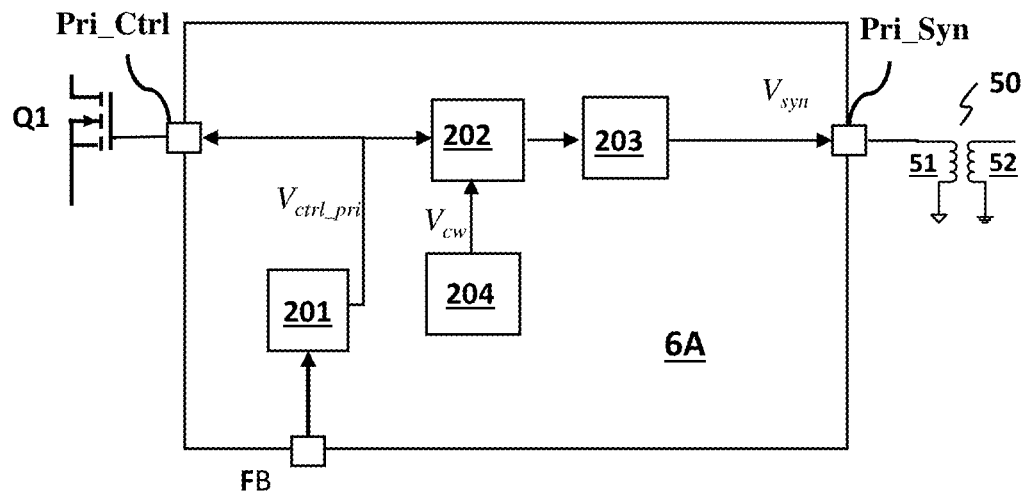
FIG. 2 depicts functional block diagram of a primary controller according to some embodiments of the present disclosure.
Figure 3:
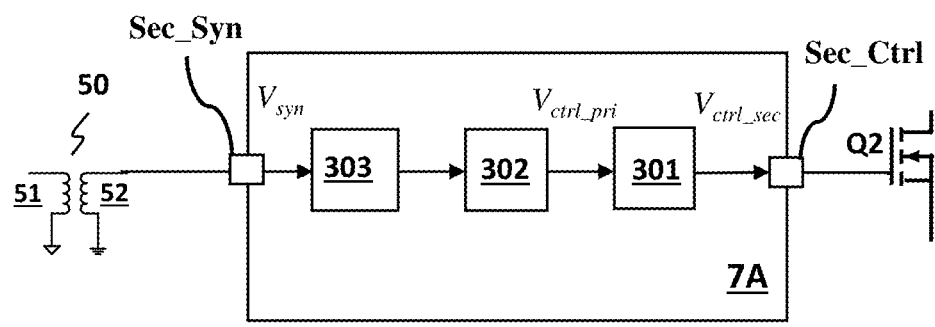
FIG. 3 depicts functional block diagram of a secondary controller according to some embodiments of the present disclosure.
Figure 4:
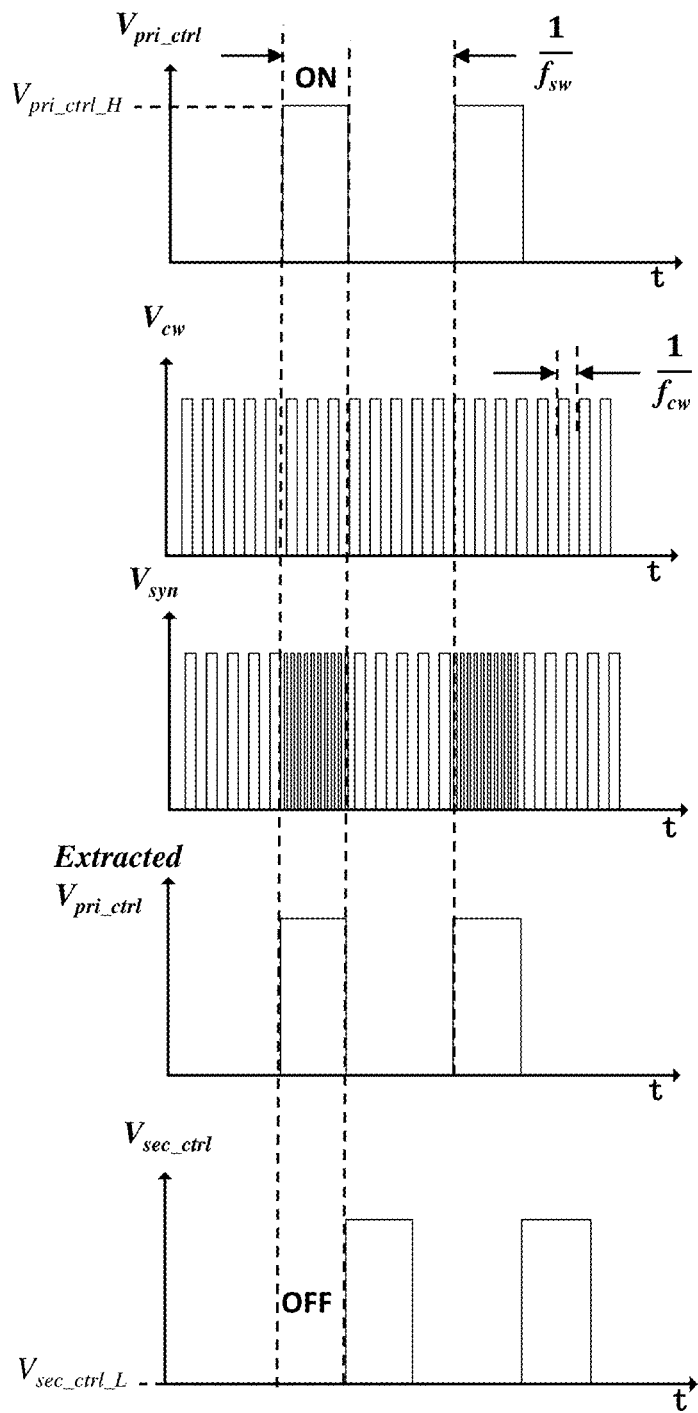
FIG. 4 shows signal waveforms when the primary controller of FIG. 2 is communicated with the secondary controller of FIG. 3.

FIG. 2 and FIG. 3 depict functional block diagrams of the primary controller 6A and the secondary controller 7A, and how they are connected to the coupler 50 in more details respectively. FIG. 4 shows signal waveforms illustrating how the primary controller 6A is communicated with the secondary controller 7A through the coupler 50.

Referring to FIG. 2. The primary controller 6A may comprise a primary driver 201, a modulator 202, a band-pass filter 203 and an oscillator 204. The primary driver 201, modulator 202, band-pass filter 203 and oscillator 204 may be integrated into a single IC chip. Alternatively, the primary driver 201, modulator 202, band-pass filter 203 and oscillator 204 may be implemented as discrete components.

The primary driver 201 may be electrically connected to the Pri_Ctrl node and FB node of the controller 6A, and configured to receive the feedback signal $V_{FB}$ from the FB node and generate the primary control signal $V_{ctrl\_pri}$ to the Pri_Ctrl node for controlling the primary switch Q1.

The oscillator 204 may be configured to continually generate a carrier wave $V_{cw}$. The modulator 202 may be electrically connected to the primary driver 201 and the oscillator 204, and configured to receive the carrier wave $V_{cw}$ from the oscillator 204 and the primary control signal $V_{ctrl\_pri}$ from the primary driver 201. The modulator 202 may be further configured to modulate the carrier wave $V_{cw}$ based on the primary control signal $V_{ctrl\_pri}$ to generate a synchronization signal $V_{syn}$.

The band-pass filter 203 may be electrically connected between the modulator 202 and the Pri_Syn node, and configured to filter out noises from the synchronization signal $V_{syn}$ before the synchronization signal $V_{syn}$ being transmitted to the Pri_Syn node and then coupled by the coupler 50.

Referring to FIG. 3. The secondary controller 7A may comprise a secondary driver 301, a demodulator 302, a band-pass filter 303. The band-pass filter 303 may be electrically connected between the Sec_Syn node and the demodulator 302, and configured to filter out noises from the synchronization signal $V_{syn}$ coupled from the coupler 50 to the Sec_Syn node.

The demodulator 302 may be electrically connected to the band-pass filter 303 and configured to receive the filtered synchronization signal $V_{syn}$ from the band-pass filter 303 and demodulate the synchronization signal $V_{syn}$ to extract the primary control signal $V_{ctrl\_pri}$.

The secondary driver 301 may be electrically connected between the demodulator 302 and the Sec_Ctrl node of the controller 7A, and configured to receive the extracted primary control signal $V_{ctrl\_pri}$ and generate the secondary control signal $V_{ctrl\_sec}$ to the Sec_Ctrl node based on the extracted primary control signal $V_{ctrl\_pri}$.

Referring to FIG. 4. When the primary control signal $V_{ctrl\_pri}$ is at a high signal value $V_{pri\_ctrl\_H}$ such that the primary switch Q1 is at ON state, the secondary control signal $V_{ctrl\_sec}$ may be generated to have a low signal value $V_{sec\_ctrl\_L}$ to control the secondary switch Q2 to be at OFF state. As such, the secondary switch may be synchronized or interlocked with the primary switch such that simultaneously tuning on the primary and secondary switches can be avoided to ensure proper functioning of the transformer.

Moreover, the synchronization signal $V_{syn}$ transferred by the coupler 50 may have a carrier frequency $f_{cw}$ in a different frequency band from the switching frequency provided by the primary control signal $V_{pri\_ctrl}$ for operating the transformer 10 so as to avoid the cross-talk between the transformer and the coupler which closely stacked and aligned to each other to share a common pair of ferrite cores.

Typically, the carrier frequency $f_{cw}$ may be in a frequency range much higher than the switching frequency $f_{sw}$ provided by the primary control signal $V_{pri\_ctrl}$. For example, the carrier frequency $f_{cw}$ may be approximately 10 to 20 times of the switching frequency $f_{sw}$. When the primary control signal $V_{pri\_ctrl}$ provides a switching frequency $f_{sw}$ in the order of a few hundred Hertz (Hz), the carrier wave $V_{cw}$ may have a frequency in the order of a few thousand Hertz.

Figure 5A:
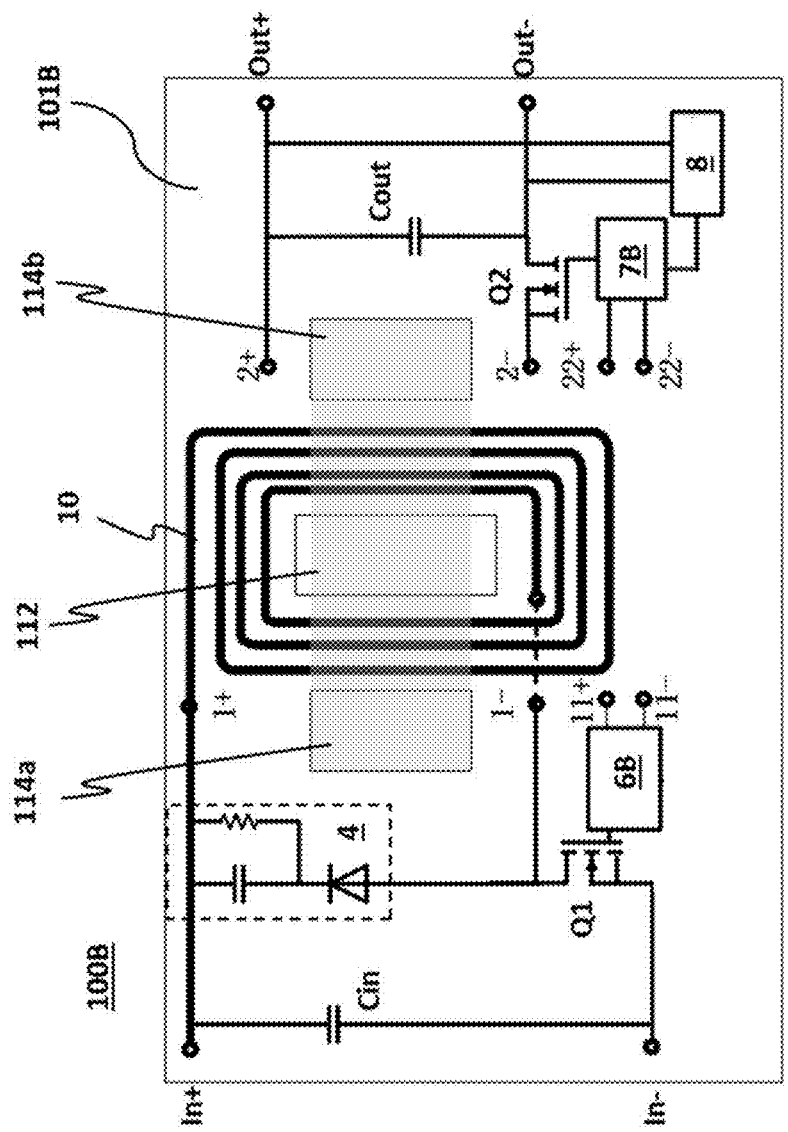
FIGS. 5A and 5B respectively depict a schematic top view and a circuit diagram of a GaN-based power converter according to other embodiments of the present disclosure.
Figure 5B:
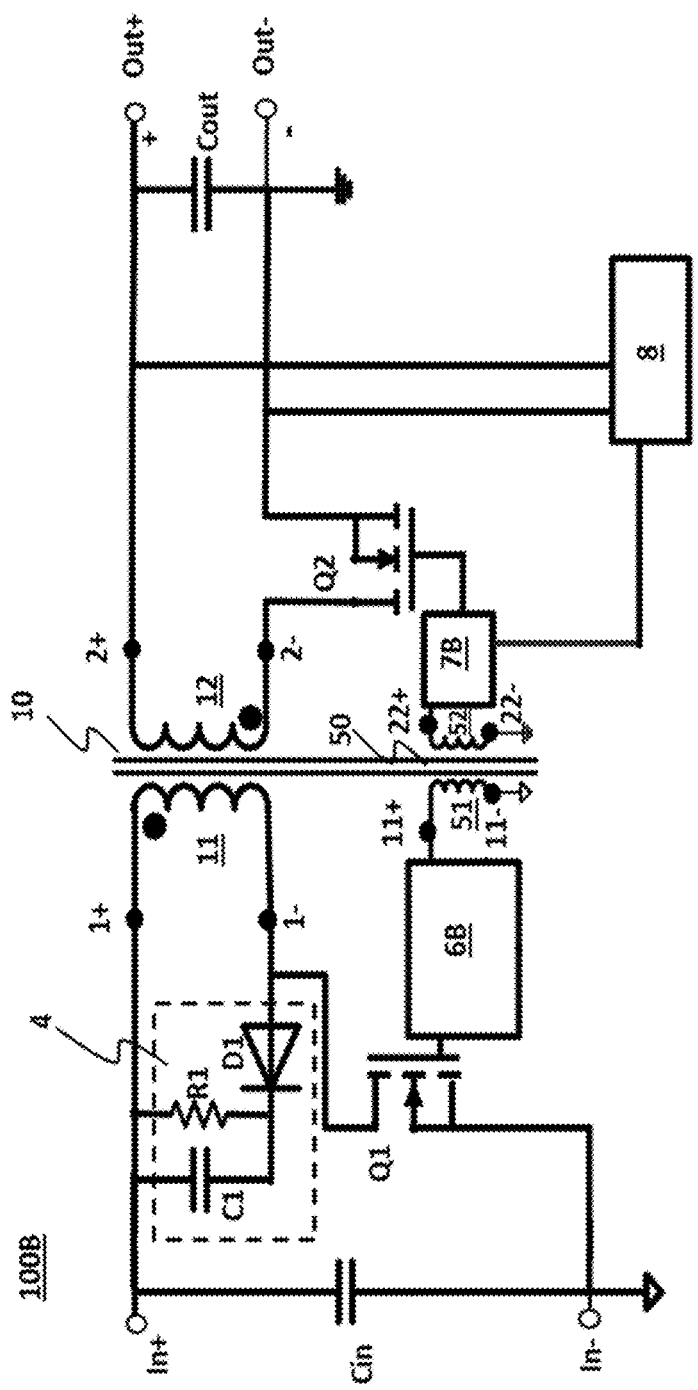

FIGS. 5A and 5B depict a schematic diagram and a circuit diagram of a GaN-based power converter 100B according to some embodiments of the present disclosure.

Referring to FIGS. 5A and 5B. The power converter 100B may comprise a multi-functional printed circuit board (PCB) 101B comprising a plurality of conducting traces and vias for integrating a plurality of components of the power converter 100B. The power converter 100B may further comprise a thermal conductive compound (not shown) for encapsulating the plurality of components the power converter 100B and the PCB 101B into a single package.

The power converter 100B may have an input port 2 having a positive input node (In+) and a negative input node (In−), and an output port 3 having a positive output node (Out+) and a negative output node (Out−).

The multi-functional PCB 101B may comprise a positive input contact to act as a positive input node (In+), a negative input contact to act as the negative input node (In−), a positive output contact to act as the positive output node (Out+) and a negative output contact to act as the negative output node (Out−).

The power converter 100B may further comprise an input capacitor Cin being attached to the PCB 100B and having a first terminal connected to the positive input contact and a second terminal connected to the negative input contact.

The power converter 100B may further comprise an output capacitor Cout being attached to the PCB 101B and having a first terminal connected to the positive output contact and a second terminal connected to the negative output contact.

The power converter 100B may further comprise a planar transformer 10 formed in the PCB and configured for transferring power from a power supply coupled to the input port 2 to a load coupled to the output port 3. The transformer 10 may comprise a transformer primary winding 11 and a transformer secondary winding 12.

The transformer primary winding 11 may have a positive primary terminal (1+) and a negative primary terminal (1−). The positive primary terminal may be electrically connected to the positive input contact. The transformer secondary winding 12 may have a positive secondary terminal (2+) and a negative secondary terminal (2−). The positive secondary terminal may be electrically connected to the positive output contact.

The power converter 100B may further comprise a clamping circuit 4 configured for clamping an input voltage to a desired DC level. The clamping circuit may have a diode D1, a capacitor C1 and a resistor R1. The diode D1 may be attached to the PCB 101B and have a positive terminal electrically connected to the second terminal of the transformer primary winding 11. The capacitor C1 may be attached to the PCB 101B and have a first terminal electrically connected to the positive input node (In+) and a second terminal electrically connected to the negative terminal of the diode D1. The resistor R1 may be attached to the PCB 101B and have a first terminal electrically connected to the positive input node (In+) and a second terminal electrically connected to the negative terminal of the diode D1.

The power converter 100B may further comprise a primary switch Q1 configured for conducting or blocking a current flowing in the transformer primary winding 11. The primary switch Q1 may be attached on the PCB 101B and have a first power terminal electrically connected to the negative primary terminal (1−) of the transformer primary winding 11 and a second power terminal electrically connected to the negative input node (In−).

The converter 100B may further comprise a secondary switch Q2 configured for conducting or blocking a current flowing in the transformer secondary winding 12. The secondary switch Q2 may be attached on the PCB 101B and have a first power terminal electrically connected to the negative secondary terminal (2−) of the transformer secondary winding 12; and a second power terminal electrically connected to the negative output node (Out−).

Preferably, each of the primary switch Q1 and secondary switch Q2 may be constructed with a transistor. The transistor may be a HEMT (High electron mobility transistor) or a MOSFET (Metal Oxide Semiconductor Field Effect Transistor). The MOSFET may be selected from a N-channel enhancement type MOSFET, a N-channel depletion type MOSFET, a P-channel enhancement type MOSFET, or a P-channel depletion type MOSFET. The transistor may be formed of or include a direct bandgap material, such as an III-V compound, which includes, but not limited to, for example, GaAs, InP, GaN, InGaAs and AlGaAs.

In some embodiments, each of the primary switch Q1 and secondary switch Q2 may be constructed with an enhancement type GaN HEMT based transistor having a drain being the first power terminal, a source being the second power terminal and a gate being the control terminal.

The power converter 100B may further comprise a primary controller 6B configured to generate a primary control signal $V_{pri\_ctrl}$ to turn on and off the primary switch Q1. The primary controller 6B may be attached on the PCB 101B and have a primary control (Pri_Ctrl) node electrically connected to a control terminal of the primary switch Q1.

The converter 100B may further comprise a secondary controller 7B configured to generate a secondary control signal $V_{sec\_ctrl}$ to turn on and off the secondary switch Q2. The secondary controller 7B may be attached on the PCB 101B and have a secondary control (Sec_Ctrl) node electrically connected to a control terminal of the secondary switch Q2.

The power converter 100B may further comprise a feedback module 8 configured for detecting a voltage across the output port 3 and feeding a feedback signal $V_{FB}$ to a feedback (FB) node of the secondary controller 7B.

The feedback module 8 may be attached on the PCB and have a first input terminal electrically connected to the positive output node (Out+), a second input terminal electrically connected to the negative output node (Out−), and an output terminal electrically connected to the feedback (FB) node of the secondary controller 7.

The power converter 100B may further comprise a planar magnetic coupler 50 formed in the PCB 101B and configured for coupling a synchronization signal from the secondary controller 7B to the primary controller 6B such that the primary controller 6B can be synchronized or cooperated with the secondary controller 7B to turn on and off the primary switch and the secondary switch alternately to ensure proper functioning of the power converter 100B.

The magnetic coupler 50 may have a coupler primary winding 51 and a coupler secondary winding 52. The coupler primary winding 51 may have a positive primary terminal (11+) electrically connected to a primary synchronization (Pri_Syn) node of the primary controller 6B and a negative primary terminal (11−) electrically connected to the negative input node (In−). The coupler secondary winding 52 may have a positive secondary terminal (22+) electrically connected to a secondary synchronization (Sec_Syn) node of the secondary controller 7B and a negative secondary terminal (22−) electrically connected to the negative output node (Out−).

The PCB 101B may comprise one or more planar conductive coils respectively formed on one or more PCB layers and aligned with each other for constructing the transformer and the coupler.

Figure 6:
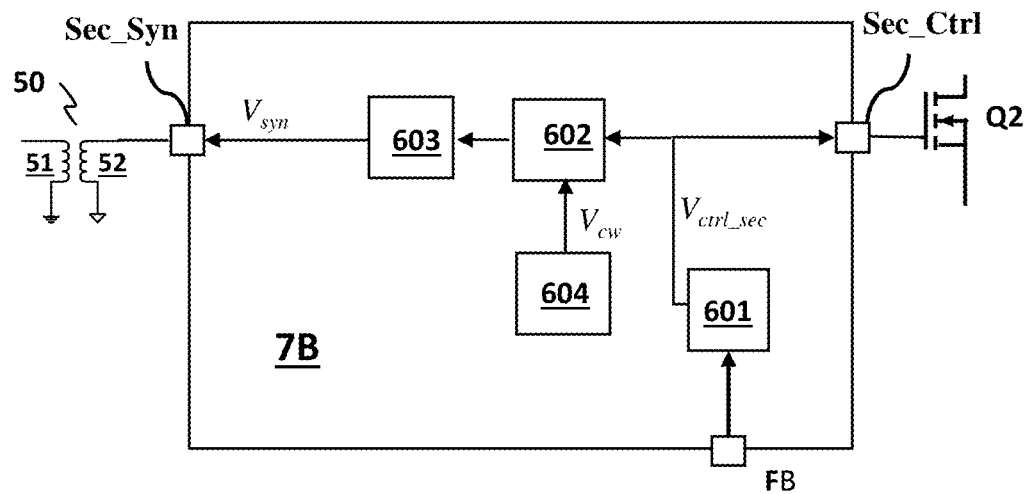
FIG. 6 depicts functional block diagram of a secondary controller according to some embodiments of the present disclosure.
Figure 7:
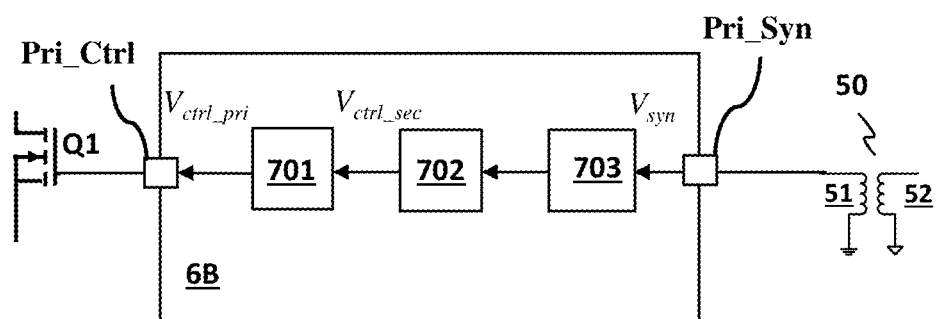
FIG. 7 depicts functional block diagram of a primary controller according to some embodiments of the present disclosure.
Figure 8:
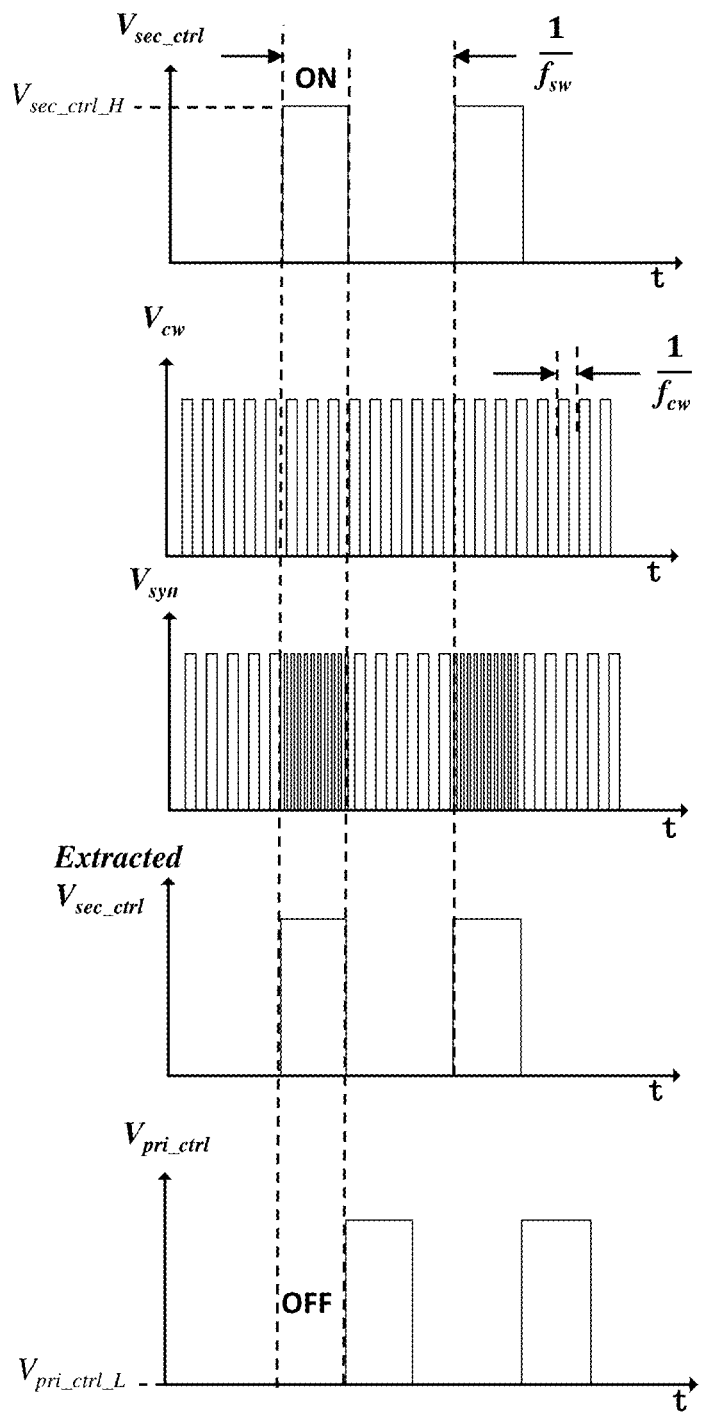
FIG. 8 shows signal waveforms when the secondary controller of FIG. 6 is communicated with the primary controller of FIG. 7.

FIG. 6 and FIG. 7 depict functional block diagrams of the secondary controller 7B and the primary controller 6B, and how they are connected to the coupler 50 in more details respectively. FIG. 8 shows signal waveforms illustrating how the primary controller 6B is communicated with the secondary controller 7B through the coupler 50.

Referring to FIG. 6. The secondary controller 7B may comprise a secondary driver 601, a modulator 602, a band-pass filter 603 and an oscillator 604. The secondary driver 601, modulator 602, band-pass filter 603 and oscillator 604 may be integrated into a single IC chip. Alternatively, the secondary driver 601, modulator 602, band-pass filter 603 and oscillator 604 may be implemented as discrete components.

The secondary driver 601 may be electrically connected to the Sec_Ctrl node and FB node of the controller 7B, and configured to receive the feedback signal $V_{FB}$ from the FB node and generate the secondary control signal $V_{ctrl\_sec}$ to the Sec_Ctrl node for controlling the secondary switch Q2.

The oscillator 604 may be configured to continually generate a carrier wave $V_{cw}$. The modulator 602 may be electrically connected to the secondary driver 601 and the oscillator 604, and configured to receive the carrier wave $V_{cw}$ from the oscillator 604 and the secondary control signal $V_{ctrl\_sec}$ from the secondary driver 601. The modulator 602 may be further configured to modulate the carrier wave $V_{cw}$ based on the secondary control signal $V_{ctrl\_sec}$ to generate a synchronization signal $V_{syn}$.

The band-pass filter 603 may be electrically connected between the modulator 602 and the Sec_Syn node, and configured to filter out noises from the synchronization signal $V_{syn}$ before the synchronization signal $V_{syn}$ being transmitted to the Sec_Syn node and then coupled by the coupler 50.

Referring to FIG. 7. The primary controller 6B may comprise a primary driver 701, a demodulator 702, a band-pass filter 703. The band-pass filter 703 may be electrically connected between the Pri_Syn node and the demodulator 702, and configured to filter out noises from the synchronization signal $V_{syn}$ coupled from the coupler 50 to the Pri_Syn node.

The demodulator 702 may be electrically connected to the band-pass filter 703 and configured to receive the filtered synchronization signal $V_{syn}$ from the band-pass filter 703 and demodulate the synchronization signal $V_{syn}$ to extract the secondary control signal $V_{ctrl\_sec}$.

The primary driver 701 may be electrically connected between the demodulator 702 and the Pri_Ctrl node of the controller 7, and configured to receive the extracted secondary control signal $V_{ctrl\_pri}$ and generate the primary control signal $V_{ctrl\_sec}$ to the Pri_Ctrl node based on the extracted secondary control signal $V_{ctrl\_sec}$.

Referring to FIG. 8. When the secondary control signal $V_{ctrl\_sec}$ is at a high signal value $V_{sec\_ctrl\_H}$ such that the secondary switch Q2 is at ON state, the primary control signal $V_{ctrl\_pri}$ may be generated to have a low signal value $V_{pri\_ctrl\_L}$ to control the primary switch Q1 to be at OFF state. As such, the primary switch may be synchronized or interlocked with the secondary switch such that simultaneously tuning on the primary and secondary switches can be avoided to ensure proper functioning of the transformer.

Moreover, the synchronization signal $V_{syn}$ transferred by the coupler 50 may have a carrier frequency $f_{cw}$ in a different frequency band from the switching frequency provided by the secondary control signal $V_{sec\_ctrl}$ for operating the transformer 10 so as to avoid the cross-talk between the transformer and the coupler which closely stacked and aligned to each other to share a common pair of ferrite cores.

Typically, the carrier frequency $f_{cw}$ may be in a frequency range much higher than the switching frequency $f_{sw}$ provided by the secondary control signal $V_{sec\_ctrl}$. For example, the carrier frequency $f_{cw}$ may be approximately 10 to 20 times of the switching frequency $f_{sw}$. When the secondary control signal $V_{sec\_ctrl}$ provides a switching frequency $f_{sw}$ in the order of a few hundred Hertz (Hz), the carrier wave $V_{cw}$ may have a frequency in the order of a few thousand Hertz.

Figure 9A:
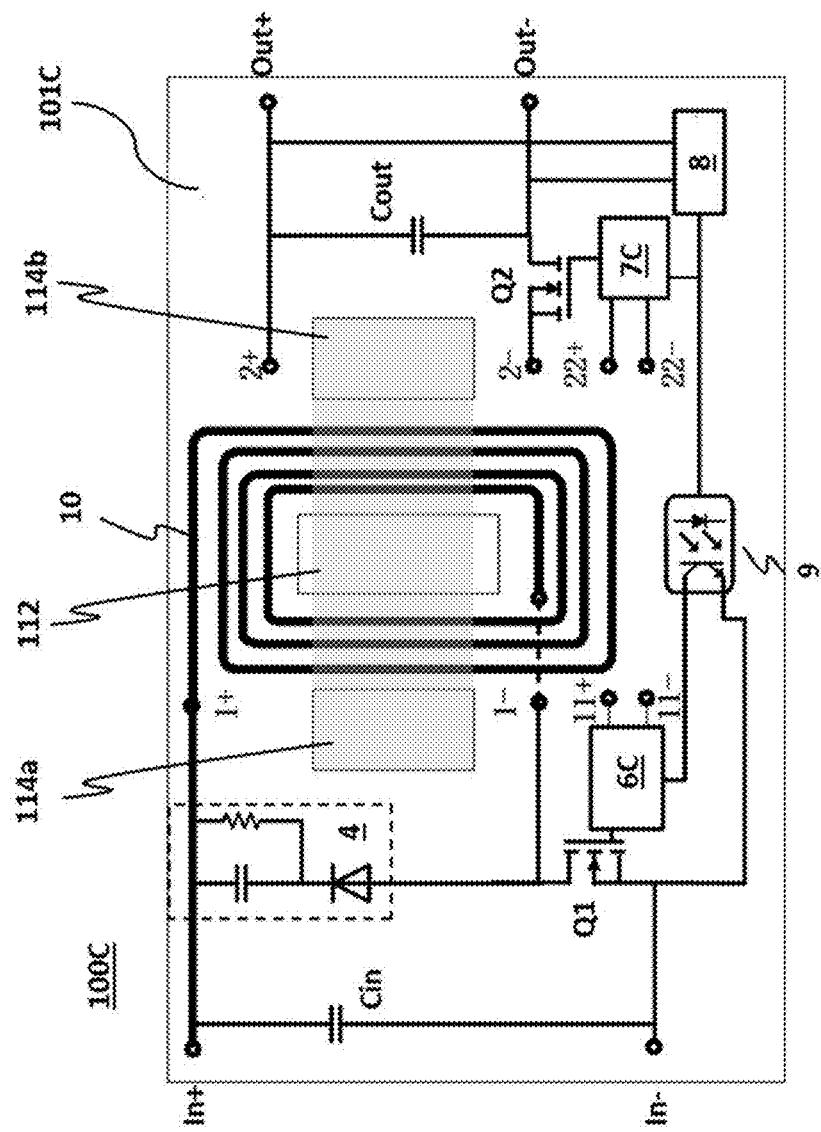
FIGS. 9A and 9B respectively depict a schematic top view and a circuit diagram of a GaN-based power converter according to other embodiments of the present disclosure.
Figure 9B:
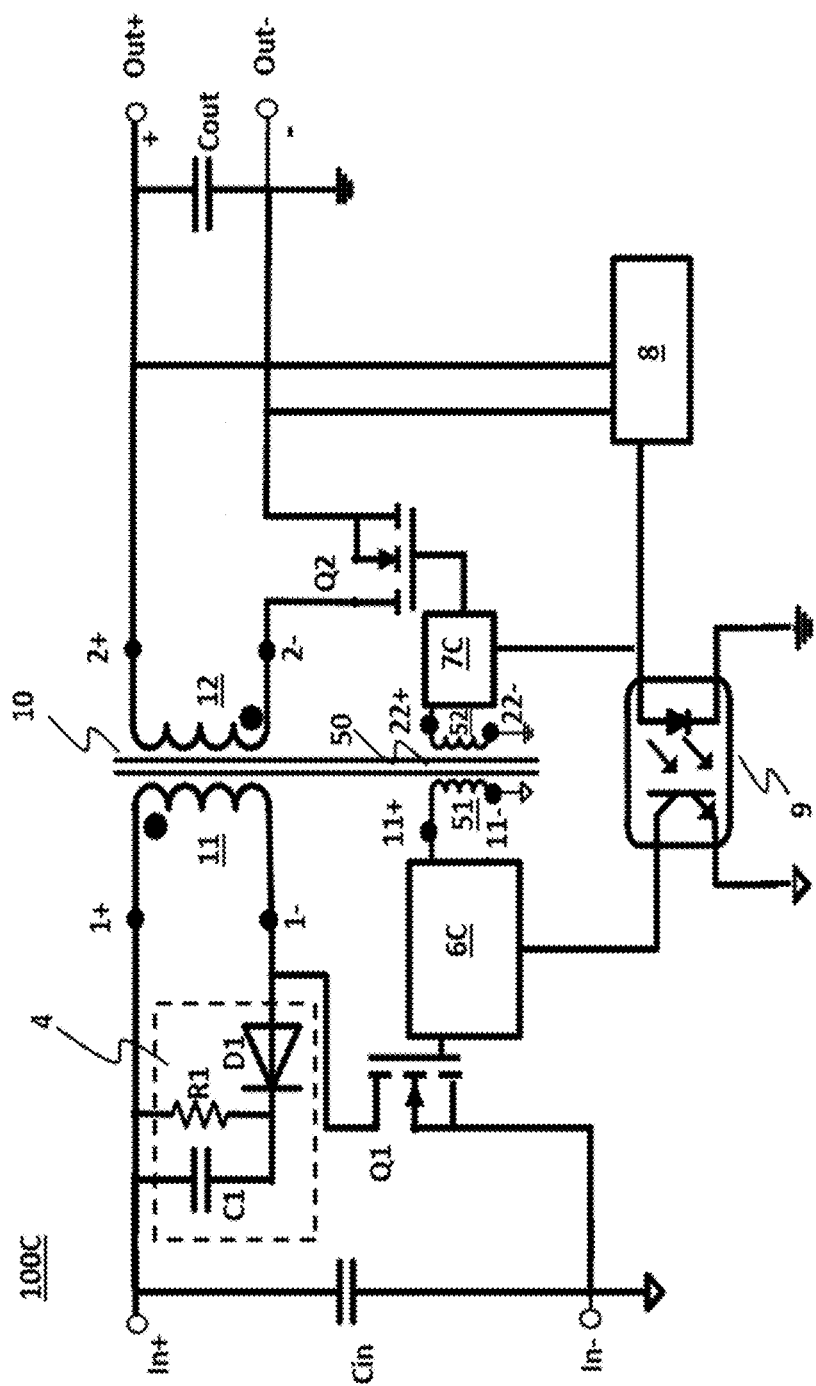

FIGS. 9A and 9B depict a schematic diagram and a circuit diagram of a GaN-based power converter 100C according to some embodiments of the present disclosure.

Referring to FIGS. 9A and 9B. The power converter 100C may comprise a multi-functional printed circuit board (PCB) 101C comprising a plurality of conducting traces and vias for integrating a plurality of components of the power converter 100C. The power converter 100C may further comprise a thermal conductive compound (not shown) for encapsulating the plurality of components the power converter 100C and the PCB 101C into a single package.

The power converter 100C may have an input port 2 having a positive input node (In+) and a negative input node (In−), and an output port 3 having a positive output node (Out+) and a negative output node (Out−).

The multi-functional PCB 101C may comprise a positive input contact to act as a positive input node (In+), a negative input contact to act as the negative input node (In−), a positive output contact to act as the positive output node (Out+) and a negative output contact to act as the negative output node (Out−).

The power converter 100C may further comprise an input capacitor Cin being attached to the PCB 100C and having a first terminal connected to the positive input contact and a second terminal connected to the negative input contact.

The power converter 100C may further comprise an output capacitor Cout being attached to the PCB 101C and having a first terminal connected to the positive output contact and a second terminal connected to the negative output contact.

The power converter 100C may further comprise a planar transformer 10 formed in the PCB and configured for transferring power from a power supply coupled to the input port 2 to a load coupled to the output port 3. The transformer 10 may comprise a transformer primary winding 11 and a transformer secondary winding 12.

The transformer primary winding 11 may have a positive primary terminal (1+) and a negative primary terminal (1−). The positive primary terminal may be electrically connected to the positive input contact. The transformer secondary winding 12 may have a positive secondary terminal (2+) and a negative secondary terminal (2−). The positive secondary terminal may be electrically connected to the positive output contact.

The power converter 100C may further comprise a clamping circuit 4 configured for clamping an input voltage to a desired DC level. The clamping circuit may have a diode D1, a capacitor C1 and a resistor R1. The diode D1 may be attached to the PCB 101C and have a positive terminal electrically connected to the second terminal of the transformer primary winding 11. The capacitor C1 may be attached to the PCB 101C and have a first terminal electrically connected to the positive input node (In+) and a second terminal electrically connected to the negative terminal of the diode D1. The resistor R1 may be attached to the PCB 101C and have a first terminal electrically connected to the positive input node (In+) and a second terminal electrically connected to the negative terminal of the diode D1.

The power converter 100C may further comprise a primary switch Q1 configured for conducting or blocking a current flowing in the transformer primary winding 11. The primary switch Q1 may be attached on the PCB 101C and have a first power terminal electrically connected to the negative primary terminal (1−) of the transformer primary winding 11 and a second power terminal electrically connected to the negative input node (In−).

The converter 100C may further comprise a secondary switch Q2 configured for conducting or blocking a current flowing in the transformer secondary winding 12. The secondary switch Q2 may be attached on the PCB 101C and have a first power terminal electrically connected to the negative secondary terminal (2−) of the transformer secondary winding 12; and a second power terminal electrically connected to the negative output node (Out−).

Preferably, each of the primary switch Q1 and secondary switch Q2 may be constructed with a transistor. The transistor may be a HEMT (High electron mobility transistor) or a MOSFET (Metal Oxide Semiconductor Field Effect Transistor). The MOSFET may be selected from a N-channel enhancement type MOSFET, a N-channel depletion type MOSFET, a P-channel enhancement type MOSFET, or a P-channel depletion type MOSFET. The transistor may be formed of or include a direct bandgap material, such as an III-V compound, which includes, but not limited to, for example, GaAs, InP, GaN, InGaAs and AlGaAs.

In some embodiments, each of the primary switch Q1 and secondary switch Q2 may be constructed with an enhancement type GaN HEMT based transistor having a drain being the first power terminal, a source being the second power terminal and a gate being the control terminal.

The power converter 100C may further comprise a primary controller 6C configured to generate a primary control signal $V_{pri\_ctrl}$ to turn on and off the primary switch Q1. The primary controller 6C may be attached on the PCB 101C and have a primary control (Pri_Ctrl) node electrically connected to a control terminal of the primary switch Q1.

The converter 100C may further comprise a secondary controller 7C configured to generate a secondary control signal $V_{sec\_ctrl}$ to turn on and off the secondary switch Q2. The secondary controller 7C may be attached on the PCB 101C and have a secondary control (Sec_Ctrl) node electrically connected to a control terminal of the secondary switch Q2.

The power converter 100C may further comprise a feedback module 8 configured for detecting a voltage across the output port 3 and feeding a feedback signal $V_{FB}$ to a feedback (FB1) node of the primary controller 6C through an opto-coupler 9 or a feedback (FB2) node of the secondary side controller 7C.

The feedback module 8 may be attached on the PCB 101C and have a first input terminal electrically connected to the positive output node (Out+), a second input terminal electrically connected to the negative output node (Out−). The feedback module 8 may further have a first output terminal electrically connected to the opto-coupler 9 and a second output terminal electrically connected to the FB2 node of the secondary controller 7C.

The opto-coupler 9 may be attached on the PCB 101C and have an input terminal electrically connected to a second output terminal of the feedback module 8, and an output terminal electrically connected to the FB1 node of the primary controller 6C.

The power converter 100C may further comprise a planar magnetic coupler 50 formed in the PCB 101C and configured for coupling a synchronization signal between the primary controller 6C and the secondary controller 7C in a half-duplex manner such that the secondary controller 7C and primary controller 6C can be synchronized or cooperated with each other to turn on and off the primary switch and the secondary switch alternately to ensure proper functioning of the power converter 100C.

The magnetic coupler 50 may have a coupler primary winding 51 and a coupler secondary winding 52. The coupler primary winding 51 may have a positive primary terminal (11+) electrically connected to a primary synchronization (Pri_Syn) node of the primary controller 6C and a negative primary terminal (11−) electrically connected to the negative input node (In−). The coupler secondary winding 52 may have a positive secondary terminal (22+) electrically connected to a secondary synchronization (Sec_Syn) node of the secondary controller 7C and a negative secondary terminal (22−) electrically connected to the negative output node (Out−).

The PCB 101C may comprise one or more planar conductive coils respectively formed on one or more PCB layers and aligned with each other for constructing the transformer and the coupler.

Figure 10:
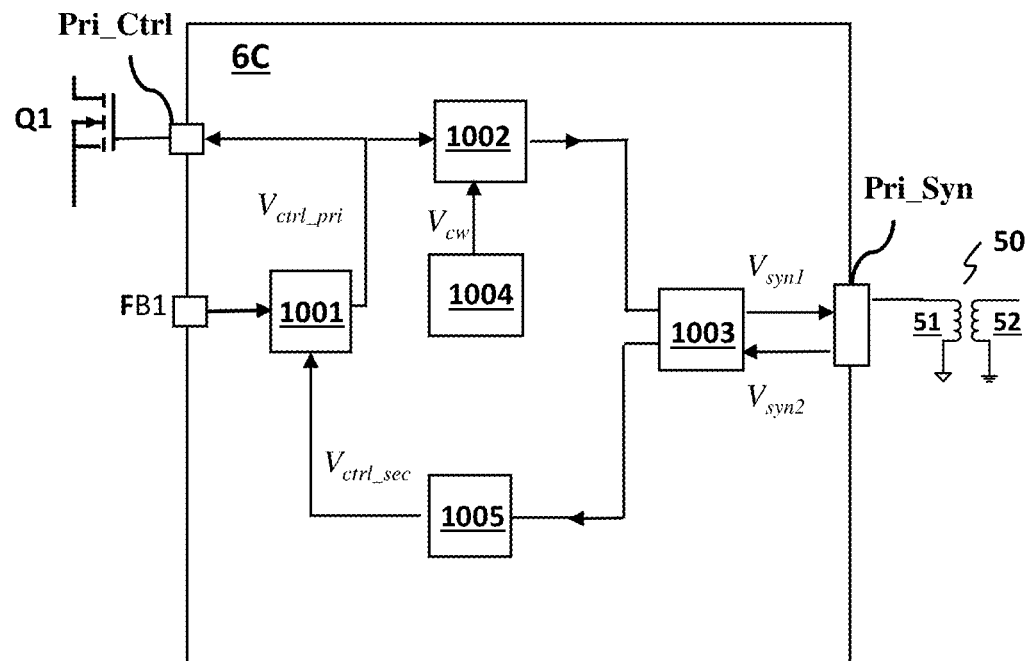
FIG. 10 depicts functional block diagram of a primary controller according to some embodiments of the present disclosure.
Figure 11:
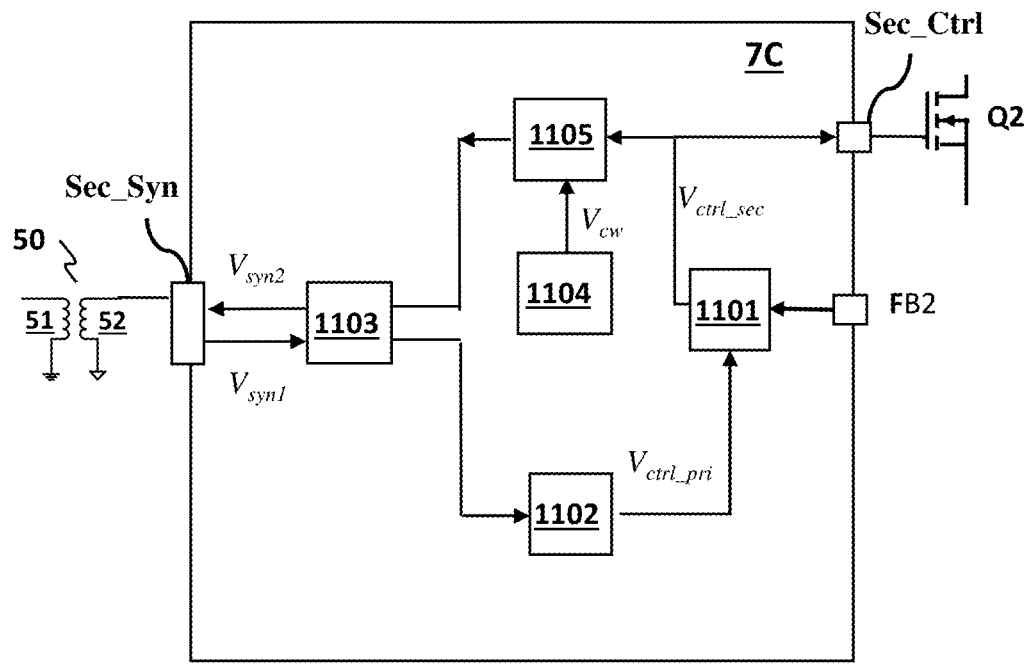
FIG. 11 depicts functional block diagram of a secondary controller according to some embodiments of the present disclosure.
Figure 12A:
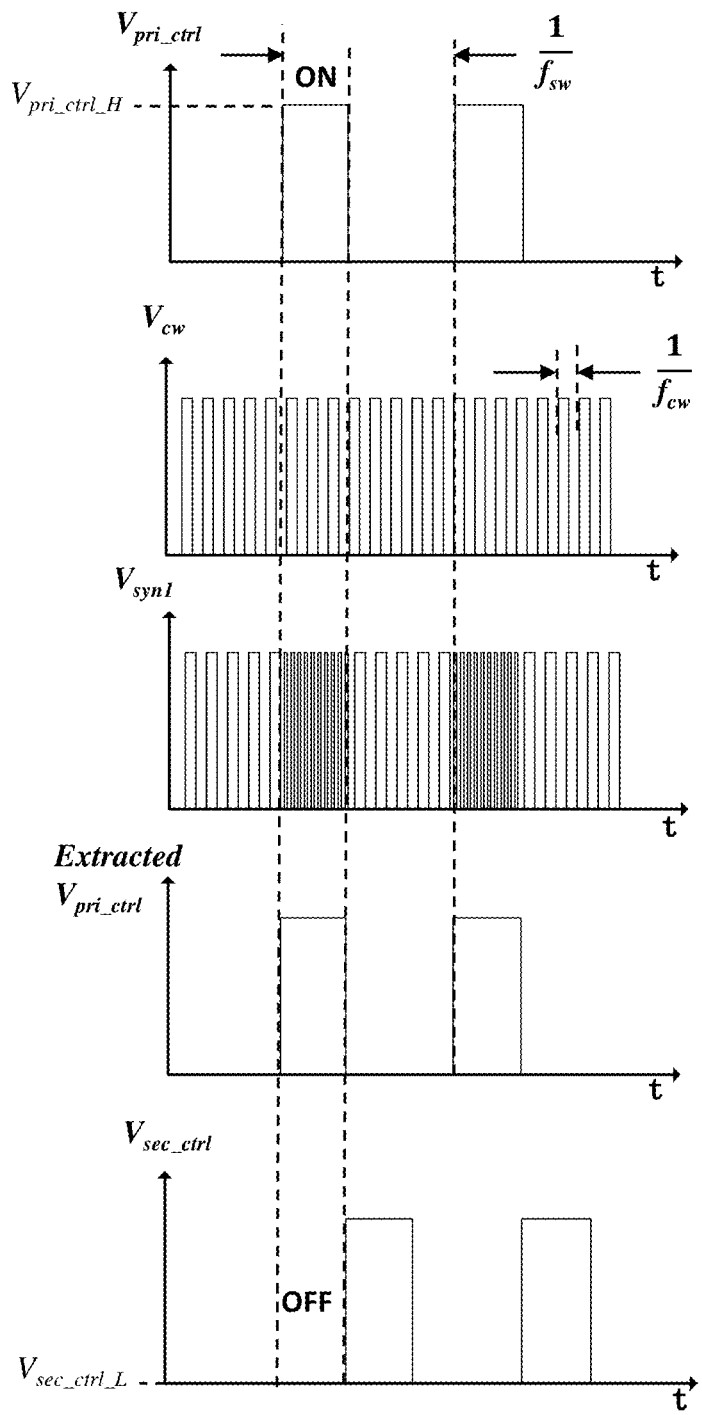
FIG. 12A shows signal waveforms when the primary controller of FIG. 10 is communicated with the secondary controller of FIG. 11 at a first communication mode.
Figure 12B:
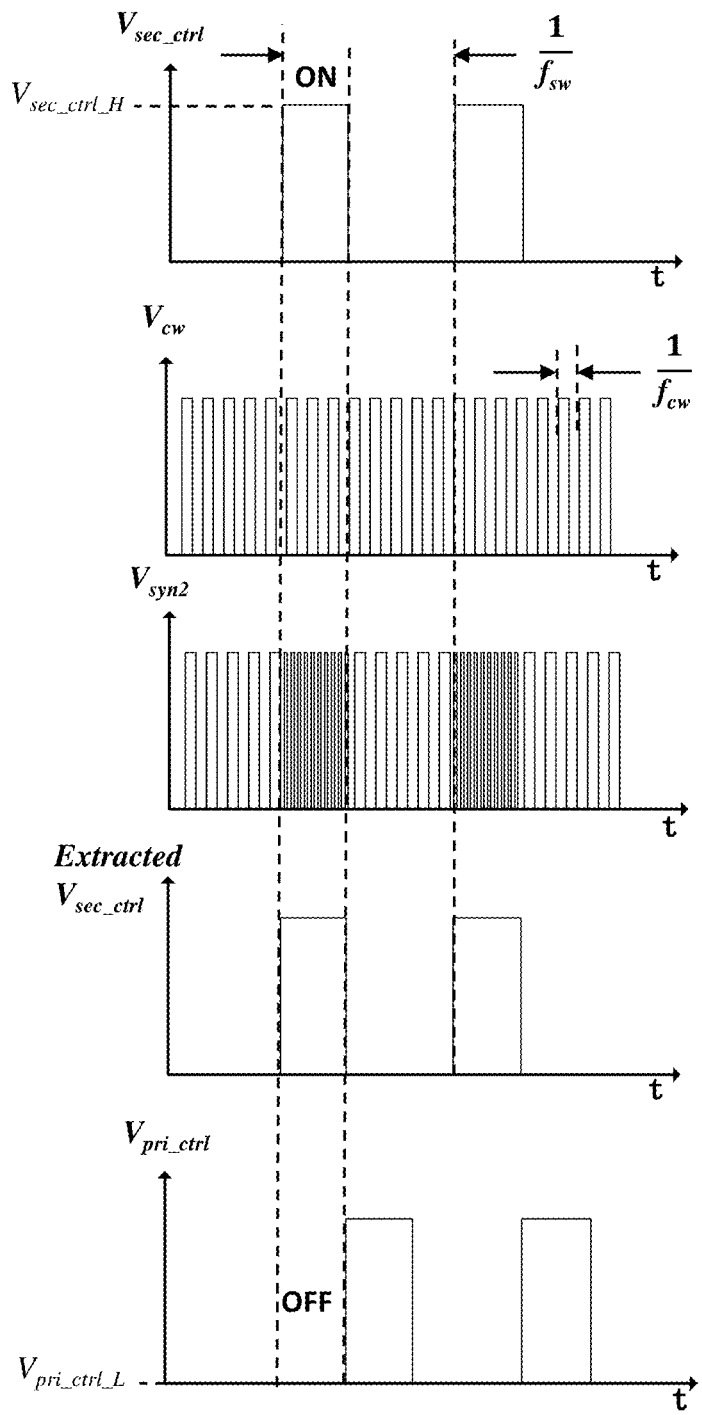
FIG. 12B shows signal waveforms when the primary controller of FIG. 10 is communicated with the secondary controller of FIG. 11 at a second communication mode.

FIG. 10 and FIG. 11 depict functional block diagrams of the primary controller 6C and the secondary controller 7C, and how they are connected to the coupler 50 in more details respectively. FIGS. 12A-12B show signal waveforms illustrating how the primary controller 6C and the secondary controller 7C are communicated with each other through the coupler 50 in a half-duplex manner.

Referring to FIG. 10. The primary controller 6C may comprise a primary driver 1001, a modulator 1002, a band-pass filter 1003, an oscillator 1004 and a demodulator 1005. The primary driver 1001, modulator 1002, band-pass filter 1003, oscillator 1004 and the demodulator 1005 may be integrated into a single IC chip. Alternatively, the primary driver 1001, modulator 1002, band-pass filter 1003, oscillator 1004 and the demodulator 1005 may be implemented as discrete components.

The primary driver 1001 may be electrically connected to the Pri_Ctrl node and the FB1 node of the controller 6C. The modulator 1002 may be electrically connected to the primary driver 1001 and the oscillator 1004. The band-pass filter 1003 may be electrically connected to the modulator 1002 and the Pri_Syn node. The demodulator 1105 may be electrically connected to the band-pass filter 1003 and the primary driver 1001.

Referring to FIG. 11. The secondary controller 7C may comprise a secondary driver 1101, a demodulator 1102, a band-pass filter 1103, an oscillator 1104 and a modulator 1105. The secondary driver 1101, demodulator 1102, band-pass filter 1103, oscillator 1104 and modulator 1105 may be integrated into a single IC chip. Alternatively, the secondary driver 1101, demodulator 1102, band-pass filter 1103, oscillator 1104 and modulator 1105 may be implemented as discrete components.

The secondary driver 1101 may be electrically connected to the Sec_Ctrl node and the FB2 node of the controller 7C. The modulator 1105 may be electrically connected to the secondary driver 1101 and the oscillator 1104. The band-pass filter 1103 may be electrically connected to the modulator 1105 and the Sec_Syn node. The demodulator 1102 may be electrically connected to the band-pass filter 1103 and the secondary driver 1101.

Referring back to FIGS. 10 and 11. The primary controller 6C and the secondary controller 7C may be operated at a first communication mode where a synchronization signal is coupled from the primary controller 6C to the secondary controller 7C through the coupler 50.

In the primary controller 6C, the primary driver 1001 may be configured to receive the feedback signal $V_{FB}$ from the FB1 node and generate the primary control signal $V_{ctrl\_pri}$ to the Pri_Ctrl node for controlling the primary switch Q1. The oscillator 1004 may be configured to continually generate a carrier wave $V_{cw}$. The modulator 1002 may be configured to receive the carrier wave $V_{cw}$ from the oscillator 1004 and the primary control signal $V_{ctrl\_pri}$ from the primary driver 1001. The modulator 1002 may be further configured to modulate the carrier wave $V_{cw}$ based on the primary control signal $V_{ctrl\_pri}$ to generate a synchronization signal $V_{syn1}$. The band-pass filter 1003 may be configured to filter out noises from the synchronization signal $V_{syn1}$ before the synchronization signal $V_{syn1}$ being transmitted to the Pri_Syn node and then coupled by the coupler 50.

In the secondary controller 7C, the band-pass filter 1103 may be configured to filter out noises from the synchronization signal $V_{syn1}$ which is coupled from the coupler 50 to the Sec_Syn node. The demodulator 1102 may be configured to receive the filtered synchronization signal $V_{syn1}$ from the band-pass filter 1103 and demodulate the synchronization signal $V_{syn1}$ to extract the primary control signal $V_{ctrl\_pri}$. The secondary driver 1101 may be configured to receive the extracted primary control signal $V_{ctrl\_pri}$ and generate the secondary control signal $V_{ctrl\_sec}$ to the Sec_Ctrl node based on the extracted primary control signal $V_{ctrl\_pri}$.

Referring to FIG. 12A. When the primary control signal $V_{ctrl\_pri}$ is at a high signal value $V_{pri\_ctrl\_H}$ such that the primary switch Q1 is at ON state, the secondary control signal $V_{ctrl\_sec}$ may be generated to have a low signal value $V_{sec\_ctrl\_L}$ to control the secondary switch Q2 to be at OFF state. As such, the secondary switch may be synchronized or interlocked with the primary switch such that simultaneously tuning on the primary and secondary switches can be avoided to ensure proper functioning of the transformer.

Moreover, the synchronization signal $V_{syn1}$ transferred by the coupler 50 may have a carrier frequency $f_{cw}$ in a different frequency band from the switching frequency provided by the primary control signal $V_{pri\_ctrl}$ for operating the transformer 10 so as to avoid the cross-talk between the transformer and the coupler which closely stacked and aligned to each other to share a common pair of ferrite cores.

Typically, the carrier frequency $f_{cw}$ may be in a frequency range much higher than the switching frequency $f_{sw}$ provided by the primary control signal $V_{pri\_ctrl}$. For example, the carrier frequency $f_{cw}$ may be approximately 10 to 20 times of the switching frequency $f_{sw}$. When the primary control signal $V_{pri\_ctrl}$ provides a switching frequency $f_{sw}$ in the order of a few hundred Hertz (Hz), the carrier wave $V_{cw}$ may have a frequency in the order of a few thousand Hertz.

Referring back to FIGS. 10 and 11. The secondary controller 7C and the primary controller 6C may be operated at a second communication mode where a synchronization signal is coupled from the secondary controller 7C to the primary controller 6C through the coupler 50.

In the secondary controller 7C, the secondary driver 1101 may be configured to receive the feedback signal $V_{FB}$ from the FB2 node and generate the secondary control signal $V_{ctrl\_sec}$ to the Sec_Ctrl node for controlling the secondary switch Q2. The oscillator 1104 may be configured to continually generate a carrier wave $V_{cw}$. The modulator 1105 may be configured to receive the carrier wave $V_{cw}$ from the oscillator 1104 and the secondary control signal $V_{ctrl\_sec}$ from the secondary driver 1101. The modulator 1102 may be further configured to modulate the carrier wave $V_{cw}$ based on the secondary control signal $V_{ctrl\_sec}$ to generate a synchronization signal $V_{syn2}$. The band-pass filter 1103 may be configured to filter out noises from the synchronization signal $V_{syn2}$ before the synchronization signal $V_{syn2}$ being transmitted to the Sec_Syn node and then coupled by the coupler 50.

In the primary controller 6C, the band-pass filter 1103 may be configured to filter out noises from the synchronization signal $V_{syn2}$ which is coupled from the coupler 50 to the Pri_Syn node. The demodulator 1105 may be configured to receive the filtered synchronization signal $V_{syn2}$ from the band-pass filter 1103 and demodulate the synchronization signal $V_{syn2}$ to extract the secondary control signal $V_{ctrl\_sec}$. The primary driver 1101 may be configured to receive the extracted secondary control signal $V_{ctrl\_sec}$ and generate the primary control signal $V_{ctrl\_Pri}$ to the Pri_Ctrl node based on the extracted secondary control signal $V_{ctrl\_sec}$.

Referring to FIG. 12B. When the secondary control signal $V_{ctrl\_sec}$ is at a high signal value $V_{sec\_ctrl\_H}$ such that the secondary switch Q2 is at ON state, the primary control signal $V_{ctrl\_pri}$ may be generated to have a low signal value $V_{pri\_ctrl\_L}$ to control the primary switch Q1 to be at OFF state. As such, the primary switch may be synchronized or interlocked with the secondary switch such that simultaneously tuning on the primary and secondary switches can be avoided to ensure proper functioning of the transformer.

Moreover, the synchronization signal $V_{syn2}$ transferred by the coupler 50 may have a carrier frequency $f_{cw}$ in a different frequency band from the switching frequency provided by the secondary control signal $V_{sec\_ctrl}$ for operating the transformer 10 so as to avoid the cross-talk between the transformer and the coupler which closely stacked and aligned to each other to share a common pair of ferrite cores.

Typically, the carrier frequency $f_{cw}$ may be in a frequency range much higher than the switching frequency $f_{sw}$ provided by the secondary control signal $V_{sec\_ctrl}$. For example, the carrier frequency $f_{cw}$ may be approximately 10 to 20 times of the switching frequency $f_{sw}$. When the secondary control signal $V_{sec\_ctrl}$ provides a switching frequency $f_{sw}$ in the order of a few hundred Hertz (Hz), the carrier wave $V_{cw}$ may have a frequency in the order of a few thousand Hertz.

Figure 13:
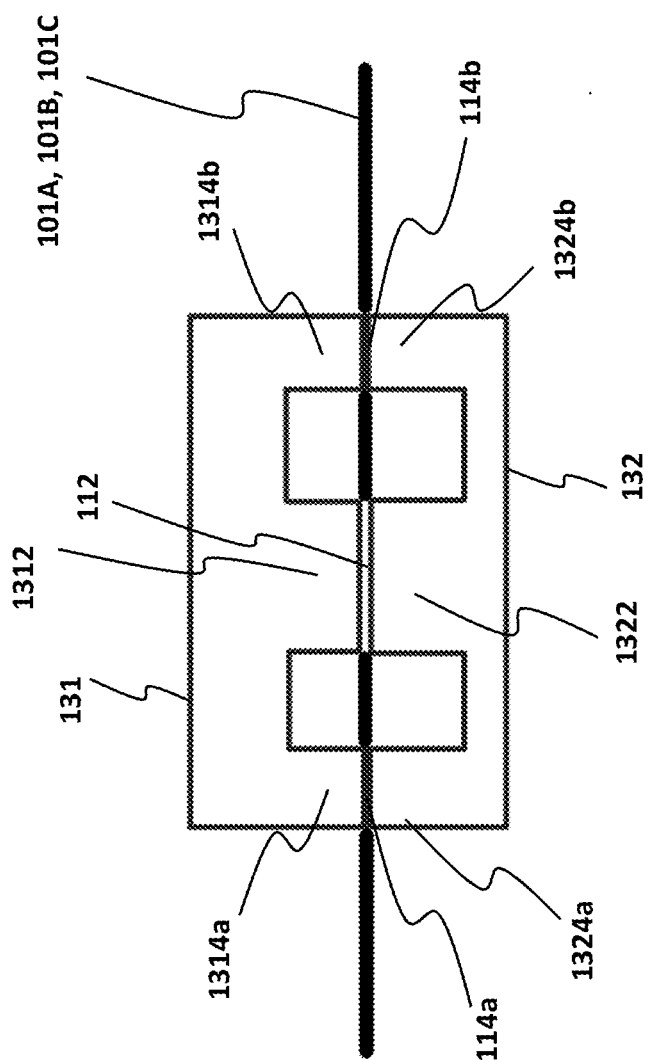
FIG. 13 depicts a simplified side view of a GaN-based power converter according to some embodiments of the present disclosure.

FIG. 13 depicts a simplified side view of the power converter 100A, which may also be applicable to the power converters 100B and 100C. Referring to FIG. 3, each of the power converters 100A, 100B and 100C may further comprise a pair of first and second ferrite cores 131 and 132 being fixed on a top surface and a bottom surface of the PCB respectively. The first and second ferrite cores 131 and 132 may be aligned with the planar conductive coils of the transformer and the coupler and commonly shared by the transformer 10 and the coupler 50 for guiding magnetic field lines and minimizing energy losses.

In some embodiments, the ferrite cores may be E-shaped. The first ferrite core 131 may include a middle protrusion 1312 and a pair of first and second side protrusions 1314a, 1314b. The second ferrite core 132 may include a middle protrusion 1322 and two side protrusions 1324a, 1324b.

Referring back to FIGS. 1A, 5A and 9A, each of the PCBs 101A, 101B and 101C may have a middle opening 112 formed at a core region of the planar conductive coils, and a pair of first and second side openings 114a, 114b formed at two opposite side regions of the planar conductive coils respectively. The middle opening 112 may have shapes matching with the middle protrusions 1312 and 1322 of the ferrite cores 131, 132. The first side openings 114a may be matched with the side protrusions 1314a and 1324a, and the second side openings 114b may be matched with the side protrusions 1314b and 1324b.

The two ferrite cores 131, 132 may be bonded with each other by aligning the middle protrusions 1312, 1322 with each other through the middle opening 112, aligning the first side protrusions 1314a and 1324a with each other through the first side opening 114a; and aligning the second side protrusions 1314b and 1324b with each other through the second side opening 124a.

Alternatively, the first ferrite core may be E-shaped and the second core may be I-shaped (not shown). The first ferrite core may include a middle protrusion and a pair of first and second side protrusions. The second ferrite core may be substantially shaped as a rectangular block. The two ferrite cores may be bonded and fixed to the PCB with aligning the middle protrusion of the first ferrite core with the middle opening 112, the first side protrusion of the first ferrite core through the first side opening 114a; and aligning the second side protrusion of the first ferrite core through the second side opening 124a.

In other embodiments, the ferrite cores may be replaced by screen-printing one or more magnetic or ferrite regions with a magnetic or ferrite polymer ink on the top surface and the bottom surface of the PCB respectively. The one or more magnetic or ferrite regions may include regions covering the core region and the two opposite side regions of the planar conductive coils respectively.

Figure 14:
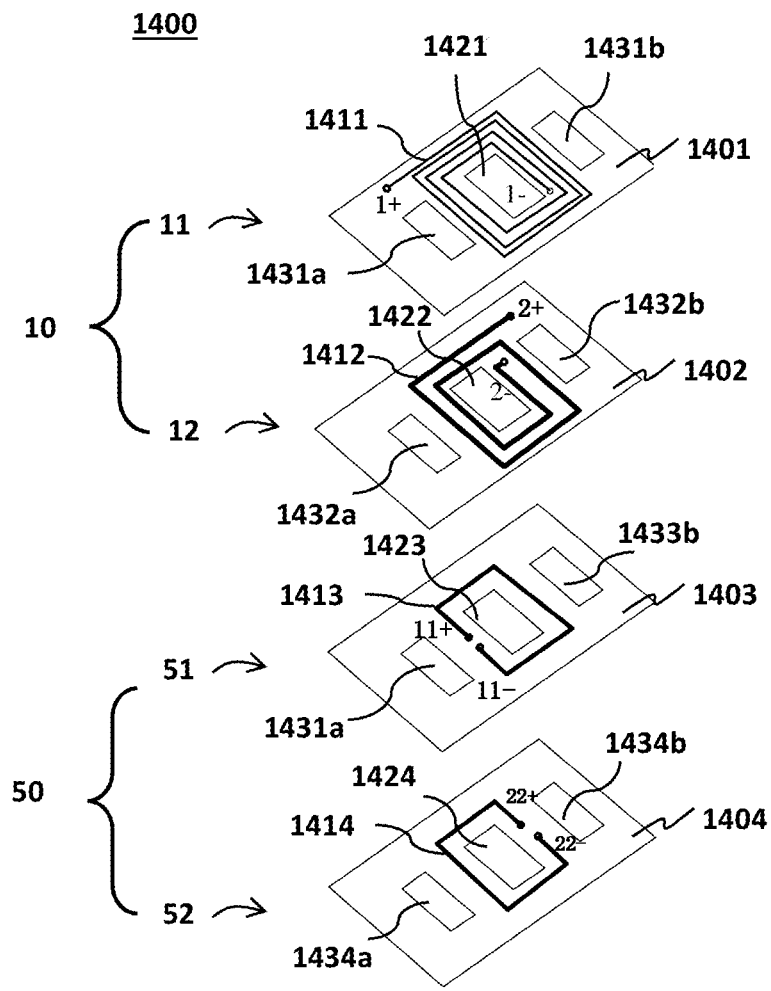
FIG. 14 depicts a simplified exploded view of a multi-functional PCB showing a built-in planar transformer and a built-in planar magnetic coupler according to some embodiments of the present disclosure.

FIG. 14 depicts a simplified exploded view of a multifunctional PCB 1400 showing a built-in planar transformer 10 and a built-in planar magnetic coupler 50 according to some embodiments of the present disclosure. Although not shown for the purpose of clarity, it should be understood that the PCB 1400 should also include other features, such as but not limited to, conductive traces and vias for providing electrical connections between the components of the power converter.

Referring to FIG. 14. The built-in transformer 10 may comprise a transformer primary winding 11 and a transformer secondary winding 12.

The transformer primary winding 11 may comprise a planar conductive coil 1411 formed on a PCB layer 1401. The transformer secondary winding 12 may comprise a planar conductive coil 1412 formed on a PCB layer 1402. The turn ratio of the transformer 10 is determined by the ratio of number of turns of the planar coil 1411 to the number of turns of the planar coil 1412.

The planar coil 1411 may be disposed around a core region 1421 and between two opposite side regions 1431a, 1431b. The planar conductive coil 1411 may have a first end and a second end configured to act as a positive primary terminal (1+) and a negative primary terminal (1−) of the transformer primary winding 11 respectively.

The planar coil 1412 may be disposed around a core region 1422 and between two opposite side regions 1432a, 1432b. The planar conductive coil 1412 may have a first end and a second end configured to act as a positive secondary terminal (2+) and a negative secondary terminal (2−) of the transformer secondary winding 12 respectively.

The PCB layer 1401 may be disposed adjacent to the PCB layer 1402 such that the planar coil 1411 is magnetically coupled with the planar coil 1412 to form a transformer layer assembly 10.

The built-in planar magnetic coupler 50 may comprise a coupler primary winding 51 and a coupler secondary winding 52. The coupler primary winding 51 may comprise a planar conductive coil 1413 formed on a PCB layer 1403. The coupler secondary winding may comprise a planar conductive coil 1414 formed on a PCB layer 1404.

The planar coil 1413 may be disposed around a core region 1423 and between two opposite side regions 1433a, 1433b. The planar conductive coil 1413 may have a first end and a second end configured to act as a positive primary terminal (11+) and a negative primary terminal (11−) of the coupler primary winding 51 respectively.

The planar coil 1414 may be disposed around a core region 1424 and between two opposite side regions 1434a, 1434b. The planar conductive coil 1414 may have a first end and a second end configured to act as a positive secondary terminal (22+) and a negative secondary terminal (22−) of the coupler secondary winding 52 respectively.

The PCB layer 1403 may be disposed adjacent to the PCB layer 1404 such that the planar coil 1413 is magnetically coupled with the planar coil 1414 to form a coupler layer assembly 50.

The PCB layers 1401-1404 may be made from any material used for multi-layer PCBs, for example, but not limited to, an epoxy resin impregnated glass fiber matrix commonly referred to as FR4 or a polyamide resin material. Other materials such as glass in the case of rigid boards or polymeric tape for flexible PCBs can also be utilized. Combinations of rigid, flexible and rigid/flexible PCBs are also encompassed by the present invention.

The formation of the planar conductive coils 1411-1414 may follow standard PCB fabrication techniques, such as for example using a photolithographic process in which undesired portions of a layer of copper bonded to the layer are selectively etched away in an acid etch bath after the copper layer has been coated with a photo resist exposed to a source of ultraviolet light through a photo mask containing the desired pattern of electrical conductors, and then developed using, for example, a potassium carbonate solution.

The PCB layers 1401-1404 may be stacked together and arranged such that the planar conductive coils 1411-1414 being collectively aligned with each other, the core regions 1421-1424 being collectively aligned with each other, and the first opposite side regions 1431a-1434a being collectively aligned with each other; and the second opposite side regions 1431b-1434b being collectively aligned with each other. As such, the transformer 10 and the coupler 50 can share a common ferrite core (not shown) for guiding magnetic field lines and minimizing energy losses.

Figure 15:
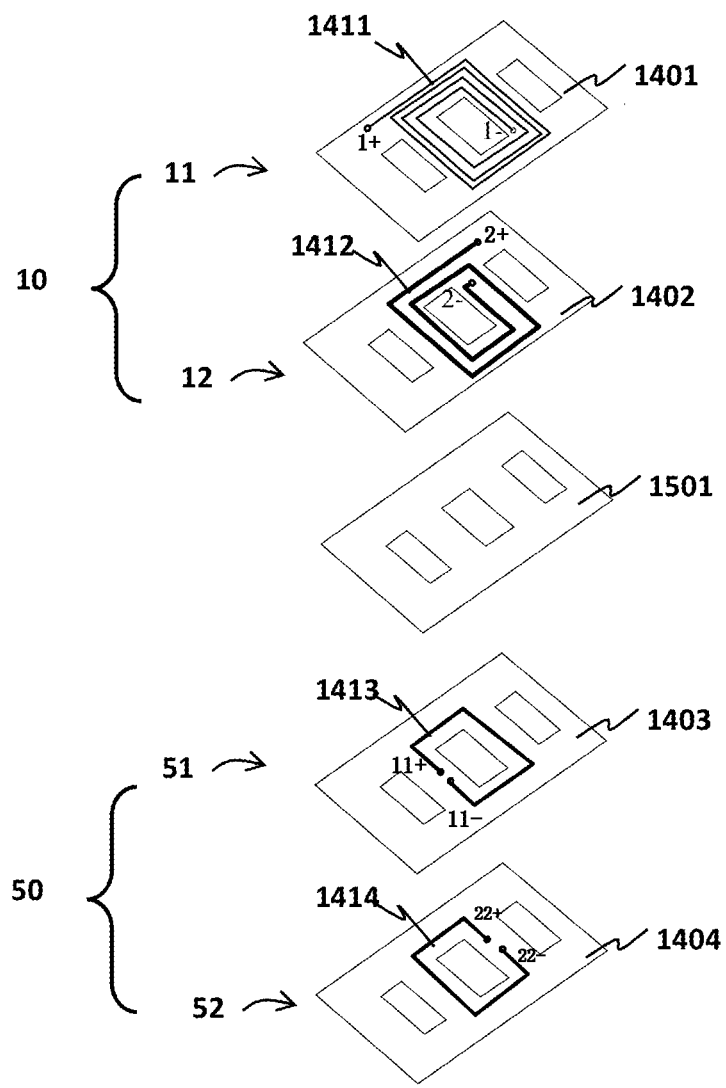
FIG. 15 depicts a simplified exploded view of a variation of the multi-functional PCB of FIG. 14.

The PCB 1400 may comprise layers in addition to the layers 1401-1404 to serve various functions. For example, the PCB 1400 may further comprise a shielding layer 1501 interposed between the transformer layer assembly and the coupler layer assembly, that is interposed between transformer 10 and the coupler 50 as shown in FIG. 15. The shielding layer may be made of copper or any other suitable conductive materials.

Figure 16:
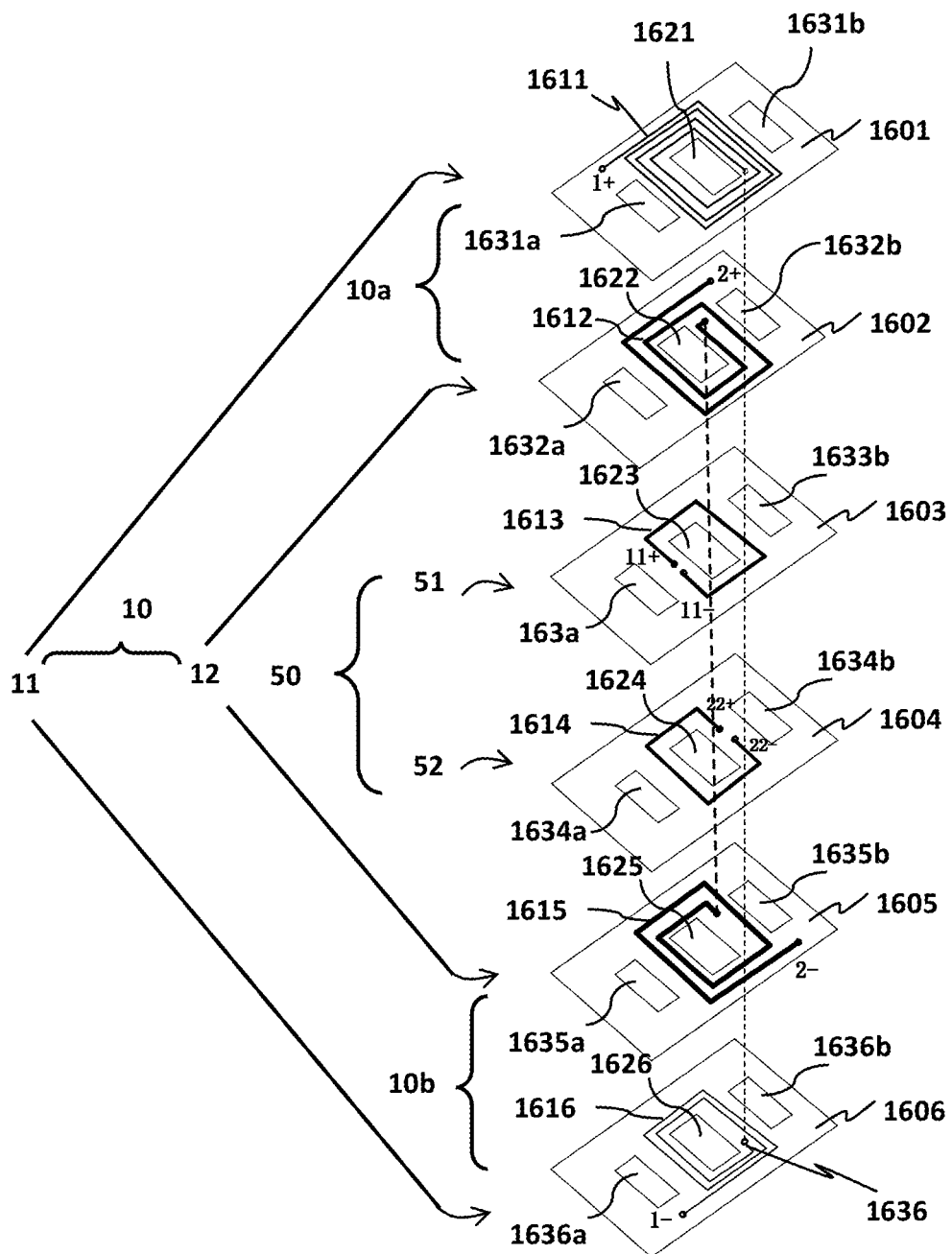
FIG. 16 depicts a simplified exploded view of a multi-functional PCB showing a built-in planar transformer and a built-in planar magnetic coupler according to other embodiments of the present disclosure.

FIG. 16 depicts a simplified exploded view of a multifunctional PCB 1600 showing a built-in planar transformer 10 and a built-in planar magnetic coupler 50 according to some embodiments of the present disclosure. Although not shown for the purpose of clarity, it should be understood that the PCB 1600 should also include other features, such as but not limited to, conductive traces and vias for providing electrical connections between the components of the power converter.

Referring to FIG. 16. The built-in transformer 10 may comprise a transformer primary winding 11 and a transformer secondary winding 12.

The transformer primary winding 11 may comprise a planar conductive coil 1611 formed on a PCB layer 1601. The transformer primary winding 11 may further comprise a planar conductive coil 1616 formed on a PCB layer 1606 and electrically connected to the planar conductive coil 1611.

The transformer secondary winding 12 may comprise a planar conductive coil 1612 formed on a PCB layer 1602. The transformer secondary winding 12 may further comprise a planar conductive coil 1615 formed on a PCB layer 1605 and electrically connected to the planar conductive coil 1612.

The turn ratio of the transformer 10 is determined by the ratio of number of turns of the planar coil 1611 to the number of turns of the planar coil 1612.

The planar coil 1611 may be disposed around a core region 1621 and between two opposite side regions 1631*a*, 1631*b*. The planar conductive coil 1611 may have a first end configured to act as a positive primary terminal (1+) of the transformer primary winding 11 and a second end electrically connected to a first end of the planar coil 1616.

The planar coil 1616 may be disposed around a core region 1626 and between two opposite side regions 1636*a*, 1636*b*. The planar conductive coil 1616 may have a first end electrically connected to the second end of the planar coil 1611 and a second end configured to act as a negative primary terminal (1−) of the transformer primary winding 11.

The planar coil 1612 may be disposed around a core region 1622 and between two opposite side regions 1632*a*, 1632*b*. The planar conductive coil 1612 may have a first end configured to act as a positive secondary terminal (2+) of the transformer secondary winding 12 and a second end electrically connected to a first end of the planar coil 1615.

The planar coil 1615 may be disposed around a core region 1625 and between two opposite side regions 1635*a*, 1635*b*. The planar conductive coil 1615 may have a first end electrically connected to the second end of the planar coil 1612 and a second end configured to act as a negative secondary terminal (2−) of the transformer secondary winding 12.

The PCB layer 1601 may be disposed adjacent to the PCB layer 1602 such that the planar coil 1611 is magnetically coupled with the planar coil 1612 to form a first transformer layer assembly 10*a*.

The PCB layer 1605 may be disposed adjacent to the PCB layer 1606 such that the planar coil 1615 is magnetically coupled with the planar coil 1616 to form a second transformer layer assembly 10*b*.

The built-in planar magnetic coupler 50 may comprise a coupler primary winding 51 and a coupler secondary winding 52. The coupler primary winding 51 may comprise a planar conductive coil 1613 formed on a PCB layer 1603. The coupler secondary winding may comprise a planar conductive coil 1616 formed on a PCB layer 1604.

The planar coil 1613 may be disposed around a core region 1623 and between two opposite side regions 1633*a*, 1633*b*. The planar conductive coil 1613 may have a first end and a second end configured to act as a positive primary terminal (11+) and a negative primary terminal (11−) of the coupler primary winding 51 respectively.

The planar coil 1614 may be disposed around a core region 1624 and between two opposite side regions 1634*a*, 1634*b*. The planar conductive coil 1614 may have a first end and a second end configured to act as a positive secondary terminal (22+) and a negative secondary terminal (22−) of the coupler secondary winding 52 respectively.

The PCB layer 1603 may be disposed adjacent to the PCB layer 1604 such that the planar coil 1613 is magnetically coupled with the planar coil 1614 to form a coupler layer assembly 50.

The PCB layers 1601-1606 may be made from any material used for multi-layer PCBs, for example, but not limited to, an epoxy resin impregnated glass fiber matrix commonly referred to as FR4 or a polyamide resin material. Other materials such as glass in the case of rigid boards or polymeric tape for flexible PCBs can also be utilized. Combinations of rigid, flexible and rigid/flexible PCBs are also encompassed by the present invention.

The formation of the planar conductive coils 1611-1616 may follow standard PCB fabrication techniques, such as for example using a photolithographic process in which undesired portions of a layer of copper bonded to the layer are selectively etched away in an acid etch bath after the copper layer has been coated with a photo resist exposed to a source of ultraviolet light through a photo mask containing the desired pattern of electrical conductors, and then developed using, for example, a potassium carbonate solution.

The PCB layers 1601-1606 may be stacked together and arranged such that the planar conductive coils 1611-1616 being collectively aligned with each other, the core regions 1621-1626 being collectively aligned with each other, and the first opposite side regions 1631*a*-1636*a* being collectively aligned with each other; and the second opposite side regions 1631*b*-1636*b* being collectively aligned with each other. As such, the transformer 10 and the coupler 50 can share a common ferrite core (not shown) for guiding magnetic field lines and minimizing energy losses.

Figure 17:
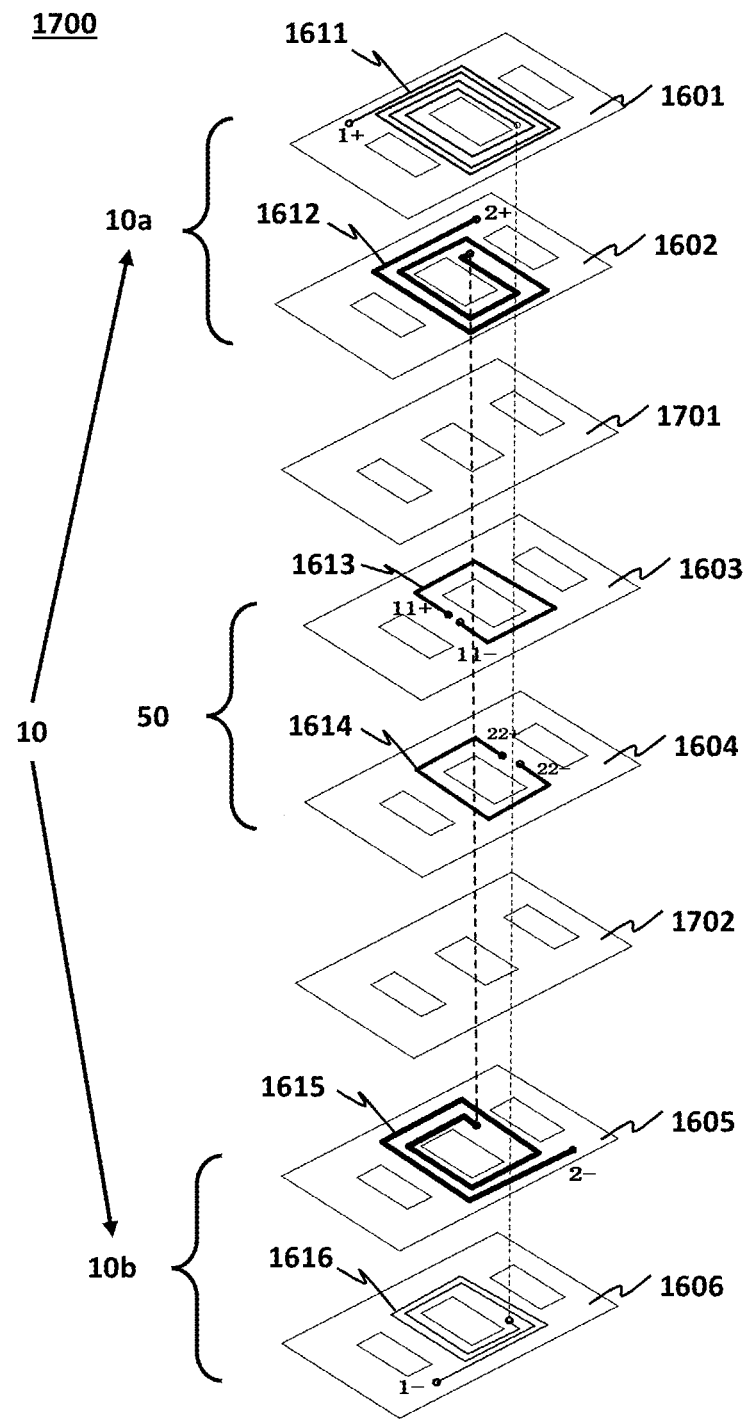
FIG. 17 depicts a simplified exploded view of a variation of the multi-functional PCB of FIG. 16.

The PCB 1600 may comprise layers in addition to the layers 1601-1604 to serve various functions. For example, as shown in FIG. 17, the PCB 1600 may further comprise a first shielding layer 1701 interposed between the first transformer layer assembly 10*a* and the coupler layer assembly 50, that is between the PCB layers 1602 and 1603; and a second shielding layer 1702 interposed between the coupler layer assembly 50 and the second transformer layer assembly 10*b*, that is between the PCB layers 1604 and 1605. The shielding layer may be made of copper or any other suitable conductive materials.

Figure 18A:
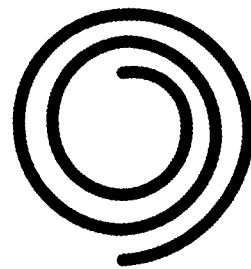
FIGS. 18A-18C depict various shapes of the planar coils according to some embodiments of the present disclosure.
Figure 18B:
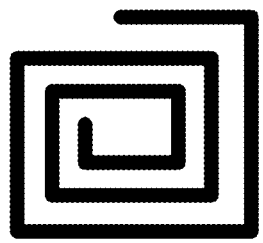
Figure 18C:
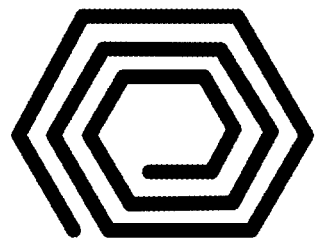

Although it is shown in FIGS. 14-17 that the planar conductive coils 1411-1414, 1611-1616 have a spiral rectangular shape, it should be understood that the planar conductive coils 1411-1414, 1611-1616 can also have other shapes such as a circular spiral shape as shown in FIG. 18A, a square spiral shape as shown in FIG. 18B or a hexagonal spiral shape as shown in FIG. 18C.

It should be also understood that the multi-functional PCB may have any suitable number of PCB layers arranged in any suitable orders for forming the planar transformer windings, and any number of PCB layers arranged in any suitable orders for forming the planar coupler windings.

Figure 19:
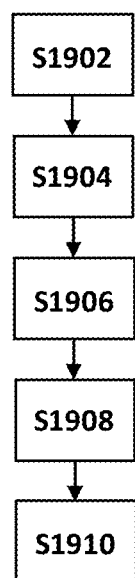
FIG. 19 depicts a flow chart of a method for manufacturing a GaN-based power converter according to an embodiment of the present disclosure.

FIG. 19 depicts a flow chart of a method for manufacturing a GaN-based power converter according to an embodiment of the present disclosure. Referring to FIG. 19, the method may comprise the following steps:

S1902: preparing a printed circuit board (PCB) comprising a plurality of planar conductive coils respectively formed on a plurality of PCB layers for constructing a transformer and a coupler, and a plurality of conducting traces and vias for integrating a plurality of electrical components of the power converter;

S1904: forming a middle opening at a central region of the plurality of planar conductive coils and two side openings at two opposite adjacent regions of the plurality of planar conductive coils;

S1906: assembling the plurality of electrical components of the power converter to the PCB, wherein the plurality of electrical components may include at least a primary switch electrically connected to the transformer primary winding; a secondary switch electrically connected to the transformer secondary winding; a primary controller electrically connected to the primary switch and the coupler primary winding; and a secondary controller electrically connected to the secondary switch and the coupler secondary winding;

S1908: fixing a pair of ferrite cores to a top surface and a bottom surface of the PCB respectively such that the E-shaped ferrite cores are bonded with each other with their middle protrusions and side protrusions aligned with their counterparts and passing through the respective middle and side openings;

S1910: encapsulating the plurality of electrical components and the PCB with a thermal conductive compound.

Figure 20:
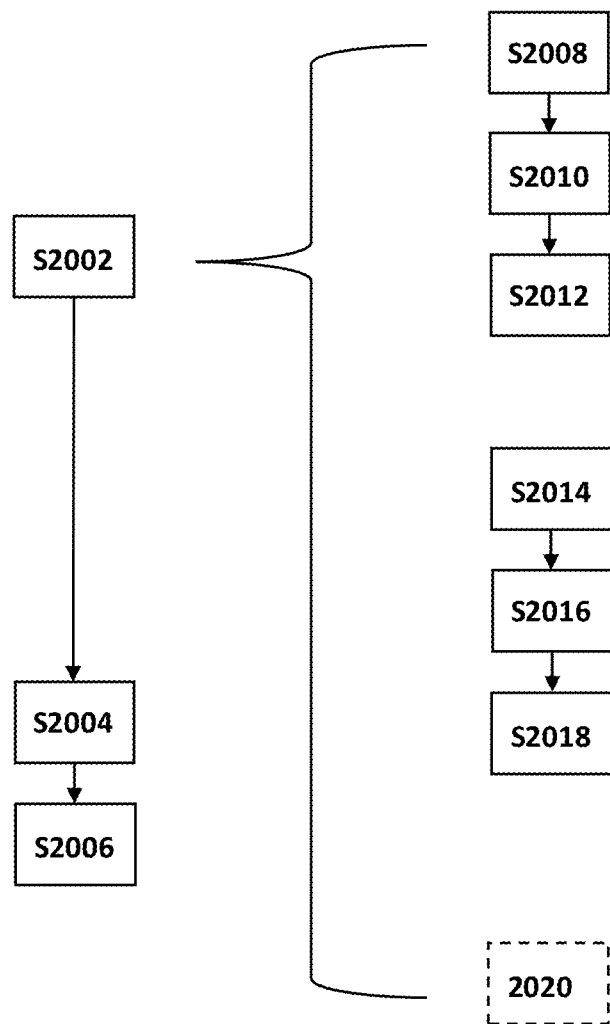
FIG. 20 depicts a flow chart of a method for manufacturing a multifunctional-PCB according to some embodiments of the present disclosure.

FIG. 20 depicts a flow chart of a method for manufacturing a multifunctional-PCB according to some embodiments of the present disclosure. Referring to FIG. 20, the method may comprise the following steps:

S2002: forming one or more planar conductive coils respectively on one or more PCB layers to construct a built-in transformer and a built-in coupler;

S2004: forming a plurality of conductive traces and conductive vias on the one or more PCB layers for providing electrical connection among the built-in transformer, the built-in coupler and the plurality of components; and S2006: stacking the one or more PCB layers and aligning the one or more planar conductive coils with each other such that the built-in transformer and the built-in coupler can share a common pair of ferrite cores.

Preferably, the construction of the built-in transformer in the step S2002 may comprise the following steps:

S2008: forming a transformer primary coil on a first PCB layer to construct the transformer primary winding;

S2010: forming a transformer secondary coil on a second PCB layer to construct the transformer secondary winding; and S2012: disposing the first PCB layer adjacent to second PCB layer such that the transformer primary coil is magnetically coupled with the transformer secondary coil to form a transformer layer assembly.

Preferably, the construction of the built-in coupler in the step S2002 may comprise the following steps:

S2014: forming a coupler primary coil on a third PCB layer to construct the coupler primary winding;

S2016: forming a coupler secondary coil on a fourth PCB layer to construct the coupler secondary winding; and S2018: disposing the third PCB layer adjacent to the fourth PCB layer such that the coupler primary coil is magnetically coupled with the coupler secondary coil to form a coupler layer assembly.

Optionally, the step S2002 may further comprise S2020: interposing a shielding layer between the transformer layer assembly and the coupler layer assembly.

Figure 21:
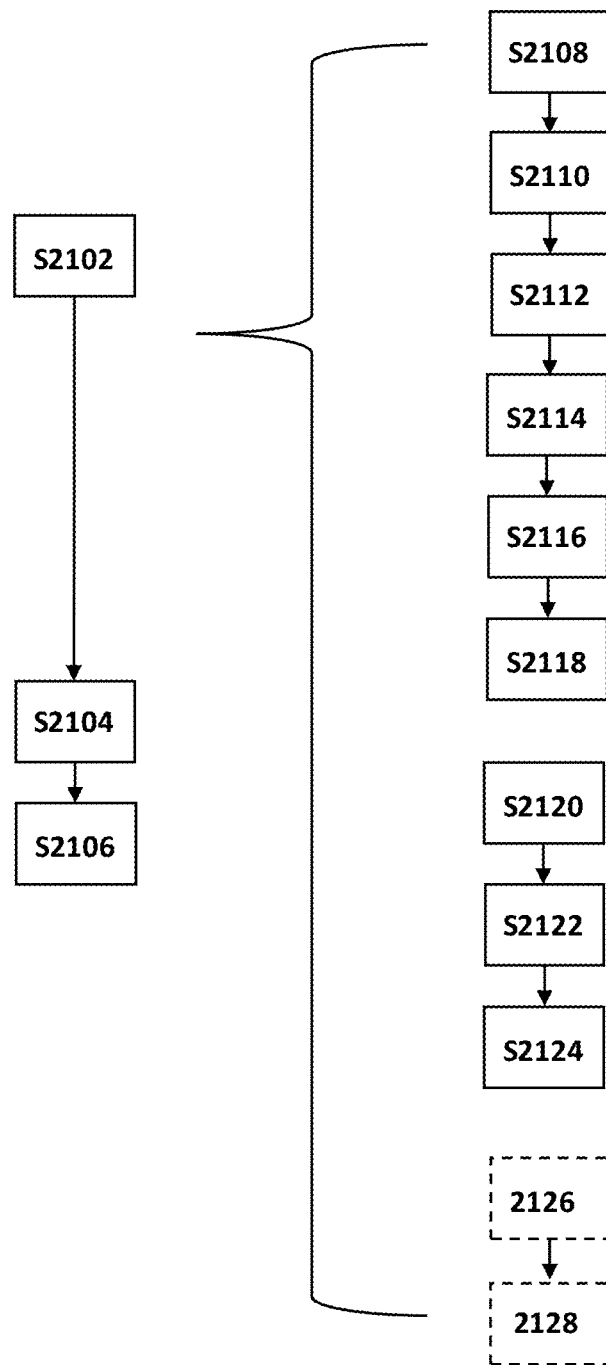
FIG. 21 depicts a flow chart of a method for manufacturing a multifunctional-PCB according to other embodiments of the present disclosure.

FIG. 21 depicts a flow chart of a method for manufacturing a multifunctional-PCB according to other embodiments of the present disclosure. Referring to FIG. 21, the method may comprise the following steps:

S2102: forming one or more planar conductive coils respectively on one or more PCB layers to construct a built-in transformer and a built-in coupler;

S2104: forming a plurality of conductive traces and conductive vias on the one or more PCB layers for providing electrical connection among the built-in transformer, the built-in coupler and the plurality of components; and S2106: stacking the one or more PCB layers and aligning the one or more planar conductive coils with each other such that the built-in transformer and the built-in coupler can share a common pair of ferrite cores.

Preferably, the construction of the built-in transformer in the step 2102 may comprise the following steps:

S2108: forming a first transformer primary coil on a first PCB layer and a second transformer primary coil on a sixth PCB layer;

S2110: electrically connecting the first transformer primary coil with the second transformer primary coil to form the transformer primary winding;

S2112: forming a first transformer secondary coil on a second PCB layer and a second transformer secondary coil on a fifth PCB layer;

S2114: electrically connecting the first transformer secondary coil with the second transformer secondary coil to form the transformer secondary winding;

S2116: disposing the first PCB layer adjacent to second PCB layer such that the first transformer primary coil is magnetically coupled with the first transformer secondary coil to form a first transformer layer assembly; and S2118: disposing the fifth PCB layer adjacent to sixth PCB layer such that the second transformer primary coil is magnetically coupled with the second transformer secondary coil to form a second transformer layer assembly.

Preferably, the construction of the built-in coupler in the step 2102 may comprise the following steps:

S2120: forming a coupler primary coil on a third PCB layer to construct the coupler primary winding;

S2122: forming a coupler secondary coil on a fourth PCB layer to construct the coupler secondary winding; and S2124: disposing the third PCB layer adjacent to the fourth PCB layer such that the coupler primary coil is magnetically coupled with the coupler secondary coil to form a coupler layer assembly.

Optionally, the step S2102 may further comprise:

S2126: interposing a first shielding layer between the first transformer layer assembly and the coupler layer assembly; and S2128: interposing a second shielding layer between the second transformer layer assembly and the coupler layer assembly.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated.

While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A multi-functional printed circuit board (PCB) for assembling a plurality of components of a GaN-based power converter in to a single package, comprising:
   a built-in transformer comprising a transformer primary winding and a transformer secondary winding;
   a built-in coupler comprising a coupler primary winding and a coupler secondary winding; and
   a plurality of conductive traces and conductive vias for providing electrical connection among the built-in transformer, the built-in coupler and the plurality of components;
wherein
   each of the transformer primary winding, the transformer secondary winding, the coupler primary winding and the coupler secondary winding is constructed with one or more planar conductive coils respectively formed on one or more PCB layers;
   the one or more PCB layers are stacked and the one or more planar conductive coils are aligned with each other such that the built-in transformer and the built-in coupler can share a common pair of ferrite cores;
   the built-in transformer is configured to transfer power by switching on and off a primary switch connected to the transformer primary winding and a secondary switch connected to the transformer secondary winding at a switching frequency;
   the built-in coupler is configured to transfer a synchronization signal between a primary-side controller configured to control the switching on and off of the primary switch and a secondary-side controller configured to control the switching on and off of the secondary switch such that the secondary-side controller and the primary-side controller can be synchronized with each other so as to ensure that the primary switch and the secondary switch turn on and off alternately; and
   the synchronization signal transferred by the built-in coupler has a carrier frequency different from the switching frequency of the built-in transformer.

2. The multi-functional printed circuit board (PCB) according to claim 1, wherein
   the transformer primary winding comprises a transformer primary coil formed on a first PCB layer;
   the transformer secondary winding comprises a transformer secondary coil formed on a second PCB layer; and
   the first PCB layer is disposed adjacent to the second PCB layer such that the transformer primary coil is magnetically coupled with the transformer secondary coil to form a transformer layer assembly.

3. The multi-functional printed circuit board (PCB) according to claim 2, wherein:
   the coupler primary winding comprises a coupler primary coil formed on a third PCB layer;
   the coupler secondary winding comprises a coupler secondary coil formed on a fourth PCB layer; and
   the third PCB layer is disposed adjacent to the fourth PCB layer such that the coupler primary coil is magnetically coupled with the coupler secondary coil to form a coupler layer assembly.

4. The multi-functional printed circuit board (PCB) according to claim 3, further comprising a shielding layer interposed between the transformer layer assembly and the coupler layer assembly.

5. The multi-functional printed circuit board (PCB) according to claim 1, wherein
   the transformer primary winding comprises:
      a first transformer primary coil formed on a first PCB layer; and
      a second transformer primary coil formed on a sixth PCB layer and electrically connected with the first transformer primary coil;
   the transformer secondary winding comprises:
      a first transformer secondary coil formed on a second PCB layer; and
      a second transformer secondary coil formed on a fifth PCB layer and electrically connected with the first transformer secondary coil;
   the first PCB layer is disposed adjacent to the second PCB layer to form a first transformer layer assembly; and
   the fifth PCB layer is disposed adjacent to the sixth PCB layer to form a second transformer layer assembly.

6. The multi-functional printed circuit board (PCB) according to claim 5, wherein:
   the coupler primary winding comprises a coupler primary coil formed on a third PCB layer;
   the coupler secondary winding comprises a coupler secondary coil formed on a fourth PCB layer; and
   the third PCB layer is disposed adjacent to the fourth PCB layer to form a coupler layer assembly.

7. The multi-functional printed circuit board (PCB) according to claim 6, further comprising:
   a first shielding layer interposed between the first transformer layer assembly and the coupler layer assembly; and
   a second shielding layer interposed between the second transformer layer assembly and the coupler layer assembly.

8. The multi-functional printed circuit board (PCB) according to claim 1, wherein
   the primary-side controller comprises a primary driver, a first modulator, a first band-pass filter, a first oscillator and a first demodulator;
   the secondary-side controller comprises a secondary driver, a second modulator, a second band-pass filter, a second oscillator and a second demodulator;
   the built-in coupler is configured to transfer the synchronization signal from the primary-side controller to the secondary-side controller when the primary-side controller and the secondary-side controller are operated in a first communication mode; and
   the built-in coupler is configured to transfer the synchronization signal from the secondary-side controller to the primary-side controller when the primary-side controller and the secondary-side controller are operated in a second communication mode.

9. The multi-functional printed circuit board (PCB) according to claim 8, wherein when the primary-side controller is operated in the first communication mode, the primary driver is configured to generate a primary control signal for controlling the primary switch.

10. The multi-functional printed circuit board (PCB) according to claim 9, wherein when the primary-side controller is operated in the first communication mode, the first oscillator is configured to continually generate a carrier wave.

11. The multi-functional printed circuit board (PCB) according to claim 10, wherein when the primary-side controller is operated in the first communication mode, the first modulator is configured to:
receive the carrier wave from the first oscillator and the primary control signal from the primary driver; and
modulate the carrier wave based on the primary control signal to generate the synchronization signal.

12. The multi-functional printed circuit board (PCB) according to claim 11, wherein when the primary-side controller is operated in the first communication mode, the primary band-pass filter is configured to filter out noises from the synchronization signal which is to be transferred by the built-in coupler.

13. The multi-functional printed circuit board (PCB) according to claim 12, wherein when the secondary-side controller is operated in the first communication mode, the secondary band-pass filter is configured to filter out noises from the synchronization signal transferred by the built-in coupler.

14. The multi-functional printed circuit board (PCB) according to claim 13, wherein when the secondary-side controller is operated in the first communication mode, the second demodulator is configured to receive the synchronization signal filtered by the secondary band-pass filter and demodulate the synchronization signal to extract the primary control signal.

15. The multi-functional printed circuit board (PCB) according to claim 14, wherein when the secondary-side controller is operated in the first communication mode, the secondary driver is configured to receive the extracted primary control signal and generate a secondary control signal for controlling the secondary switch based on the extracted primary control signal.

16. The multi-functional printed circuit board (PCB) according to claim 8, wherein when the secondary-side controller is operated in the second communication mode, the secondary driver is configured to generate a secondary control signal for controlling the secondary switch.

17. The multi-functional printed circuit board (PCB) according to claim 16, wherein when the secondary-side controller is operated in the second communication mode, the second oscillator is configured to continually generate a carrier wave.

18. The multi-functional printed circuit board (PCB) according to claim 17, wherein when the secondary-side controller is operated in the second communication mode, the second modulator is configured to:
receive the carrier wave from the second oscillator and the secondary control signal from the secondary driver; and
modulate the carrier wave based on the secondary control signal to generate the synchronization signal.

19. The multi-functional printed circuit board (PCB) according to claim 18, wherein when the secondary-side controller is operated in the second communication mode, the secondary band-pass filter is configured to filter out noises from the synchronization signal which is to be transferred by the built-in coupler.

20. The multi-functional printed circuit board (PCB) according to claim 19, wherein when the primary-side controller is operated in the second communication mode, the primary band-pass filter is configured to filter out noises from the synchronization signal transferred by the built-in coupler; the first demodulator is configured to receive the synchronization signal filtered by the primary band-pass filter and demodulate the synchronization signal to extract the secondary control signal; and the primary driver is configured to receive the extracted secondary control signal and generate a primary control signal for controlling the primary switch based on the extracted secondary control signal.

* * * * *